United States Patent
Shimura

(10) Patent No.: US 8,086,814 B2
(45) Date of Patent: Dec. 27, 2011

(54) SEMICONDUCTOR INTEGRATED CIRCUIT APPARATUS

(75) Inventor: Hidekichi Shimura, Tokyo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/758,207

(22) Filed: Apr. 12, 2010

(65) Prior Publication Data

US 2010/0194455 A1    Aug. 5, 2010

Related U.S. Application Data

(63) Continuation of application No. 11/684,897, filed on Mar. 12, 2007, now Pat. No. 7,757,062.

(30) Foreign Application Priority Data

Mar. 13, 2006  (JP) .................. 2006-068400

(51) Int. Cl.
G06F 12/00 (2006.01)

(52) U.S. Cl. .................. 711/167; 711/E12.07

(58) Field of Classification Search .................... 711/167
See application file for complete search history.

(56) References Cited

U.S. PATENT DOCUMENTS

| | | | |
|---|---|---|---|
| 5,467,461 A | 11/1995 | Nasu et al. | |
| 5,745,375 A | 4/1998 | Reinhardt et al. | |
| 5,758,132 A | 5/1998 | Strahlin | |
| 5,925,133 A | 7/1999 | Buxton et al. | |
| 6,026,498 A * | 2/2000 | Fuse et al. ............. | 713/600 |
| 6,072,846 A * | 6/2000 | Kyung et al. ............ | 375/354 |
| 6,073,244 A | 6/2000 | Iwazaki | |
| 6,131,114 A | 10/2000 | Guezou et al. | |
| 6,496,729 B2 | 12/2002 | Thompson | |
| 6,868,503 B1 | 3/2005 | Maksimovic et al. | |
| 7,103,792 B2 | 9/2006 | Moon | |
| 7,227,809 B2 | 6/2007 | Kwak | |
| 7,266,641 B2 | 9/2007 | Kamei et al. | |
| 2002/0108019 A1 | 8/2002 | Allen et al. | |
| 2004/0103253 A1 | 5/2004 | Kamei et al. | |
| 2004/0252802 A1 | 12/2004 | Yamaguchi | |
| 2005/0102560 A1 | 5/2005 | Taketoshi et al. | |
| 2006/0041774 A1 | 2/2006 | Shimura | |
| 2006/0202230 A1 | 9/2006 | Shimura | |

(Continued)

FOREIGN PATENT DOCUMENTS

JP      3-161815      7/1991

(Continued)

OTHER PUBLICATIONS

Flautner et al., "A Combined Hardware-Software Approach for Low-Power SoCs: Applying Adaptive Voltage Scaling and Intelligent Energy Management Software," DesignCon 2003, System-on-Chip and ASIC Designe Conference.

(Continued)

Primary Examiner — Reginald Bragdon
Assistant Examiner — Hamdy S Ahmed
(74) Attorney, Agent, or Firm — Greenblum & Bernstein, P.L.C.

(57) ABSTRACT

A semiconductor integrated circuit apparatus includes a main clock generation circuit that generates a main clock signal, a plurality of function blocks, a clock generation circuit in the plurality of function blocks, and a phase locked loop circuit in the clock generation circuit. The phase locked loop circuit generates a clock signal in the plurality of function blocks, using the main clock signal from the main clock generation circuit.

6 Claims, 17 Drawing Sheets

U.S. PATENT DOCUMENTS

2007/0109703 A1    5/2007    Shimura

FOREIGN PATENT DOCUMENTS

| | | |
|---|---|---|
| JP | 4-175941 | 6/1992 |
| JP | 5-20278 | 1/1993 |
| JP | 8-263466 | 10/1996 |
| JP | 10-161769 | 6/1998 |
| JP | 10-313264 | 11/1998 |
| JP | 11-212939 A | 8/1999 |
| JP | 11-224137 | 8/1999 |
| JP | 2001-022710 | 1/2001 |
| JP | 2001-34573 | 2/2001 |
| JP | 2002-006981 | 1/2002 |
| JP | 2002-99433 | 4/2002 |
| JP | 2003-108260 | 4/2003 |
| JP | 2004-178016 | 6/2004 |
| JP | 2004-234047 | 8/2004 |
| JP | 2005-128937 | 5/2005 |
| JP | 2005-157929 | 6/2005 |

OTHER PUBLICATIONS

Fujiyoshi et al., "An H.264/MPEG-4 Audio/Visual Codec LSI with Module-Wise Dynamic Voltage/Frequency Scaling," 2005 IEEE International Solid-State Circuits Conference, pp. 132-133 and 589.

* cited by examiner

SEMICONDUCTOR INTEGRATED CIRCUIT APPARATUS

CROSS REFERENCE TO RELATED APPLICATIONS

This application is a Continuation of U.S. patent application Ser. No. 11/684,897, filed on Mar. 12, 2007 now U.S. Pat. No. 7,757,062 B2, which claims the priority of Japanese Patent Application No. 2006-068400 filed on Mar. 13, 2006 including the specification, drawings and abstract are incorporated herein by reference in their entirety.

BACKGROUND OF THE INVENTION

1. Field of the Invention

The present invention relates to a semiconductor integrated circuit apparatus that incorporates a variety of functions, and more particularly to data transfer between function blocks within a system LSI (Large Scale Integration) suitable for low-power-consumption implementation using Adaptive Voltage Scaling technology.

2. Description of the Related Art

With the level of semiconductor integration continuing to quadruple every three years for more than 10 years, the scale of semiconductor integrated circuits has become immense, and major changes have also been made in the approach to semiconductor integrated circuit chip FIG. 1 is a block diagram showing the configuration of a system LSI.

In FIG. 1, a semiconductor integrated circuit apparatus 10 is configured by means of a general-purpose CPU 11, a DSP (Digital Signal Processor) 12, a dedicated circuit 13 (dedicated circuit <1>), a dedicated circuit 14 (dedicated circuit <2>), an SDRAM (Synchronous Dynamic RAM) access control circuit 15, a DMA (Direct Memory Access) controller 16, and so forth, which are interconnected via a common bus 17. CPU 11 and DSP 12 have internal memory 11a and 12a respectively. This semiconductor integrated circuit apparatus 10 is normally provided with large-capacity external SDRAM 18, and is used in a Unified Memory configuration.

Even at present there is a possibility of demands concerning functions incorporated in a semiconductor integrated circuit changing in whirlwind fashion from day to day, and if some functions are configured in the manner of dedicated circuit <1> and dedicated circuit <2> as shown in FIG. 1, it may not be possible to respond promptly to such desired changes.

Consequently, there is currently an ongoing trend of using a so-called [multifunction DSP+extension function] configuration for functions centered on computational functions other than those of a general-purpose CPU, and providing for specifications that may possibly change by means of software in the multifunction DSPs, as shown in FIG. 2.

FIG. 2 is a block diagram showing another configuration of a system LSI. Configuration elements identical to those in FIG. 1 are assigned the same codes as in FIG. 1.

In FIG. 2, a semiconductor integrated circuit apparatus 20 is configured by means of a general-purpose CPU 11, a computational function section 23 comprising a multifunction DSP 21 (multifunction DSP <1>) and extension function 22 (extension function <1>), a computational function section 26 comprising a multifunction DSP 24 (multifunction DSP <2>) and extension function 25 (extension function <2>), an SDRAM control circuit 15, a DMA controller 16, local buses 27 through 29 located on the function block side, a global bus 30 located on the SDRAM control circuit 15 and DMA controller 16 side, and bus bridges 31 through 33 that connect local buses 27 through 29 to global bus 30. Multifunction DSP 21 (multifunction DSP <1>) has internal memory 21a. In the bus configuration, local buses 27 through 29 are assigned to the respective function blocks, global bus 30 is located on the SDRAM control circuit 15 side, and bus bridges 31 through 33 are located between local buses 27 through 29 and global bus 30.

As more and more functions become incorporated in semiconductor integrated circuits in line with future advances in semiconductor processes, the configuration of semiconductor integrated circuit apparatuses can be expected to change further in the manner illustrated in FIG. 3.

FIG. 3 is a block diagram showing yet another configuration of a system LSI. Configuration elements identical to those in FIG. 2 are assigned the same codes as in FIG. 2.

In FIG. 3, a semiconductor integrated circuit apparatus 40 is configured by means of one general-purpose CPU 11, a plurality of (here, four) general-purpose computational processors 41 through 44 that have internal memory 41a through 44a respectively, an SDRAM control circuit 15, a DMA controller 16, an I/O control circuit 45 that controls a peripheral I/O group 60, a local bus 46 located on the CPU 11 and I/O control circuit 45 side, local buses 47 through 50 located on the general-purpose computational processor 41 through 44 side, a global bus 51 located between local bus 46 and local buses 47 through 50, bus bridges 52 through 55 that connect local buses 47 through 50 to global bus 51, and a bus bridge 56 that connects local bus 46 to global bus 51.

Thus, in this semiconductor integrated circuit apparatus 40, one CPU 11 and a plurality of (from four to eight or so) general-purpose computational processors 41 through 44 are connected to local buses 46 through 50 and global bus 51 via bus bridges 52 through 56, large-capacity SDRAM 18 is located externally, and SDRAM control circuit 15 performs SDRAM 18 arbitration with CPU 11, general-purpose computational processors 41 through 44, DMA controller 16, and so forth.

The most serious problem when the level of integration of a semiconductor integrated circuit apparatus is raised as described above is increased power consumption during operation and in standby mode. The technologies receiving the greatest attention as means of solving this problem are Dynamic Voltage Scaling (DVS) and Adaptive Voltage Scaling. Details of these technologies are given in the documents below (for example, Documents 1 and 2, and Non-patent Documents 1 and 2), and therefore a description of these technologies is omitted here. Document 1 is the Specification of U.S. Pat. No. 5,745,375, and Document 2 is the Specification of U.S. Pat. No. 6,868,503. Non-patent Document 1 is "A Combined Hardware-Software Approach for Low-Power SoC: Applying Adaptive Voltage Scaling and Intelligent Energy Management Software", Design 2003 (System-on-Chip and ASIC Design Conference), and Non-patent Document 2 is "An H.264/MPEG-4 Audio/Visual Codec LSI with Module-Wise Dynamic Voltage/Frequency Scaling", ISSCC2005 Dig. Tech. Papers, pp. 132-133.

However, the following kinds of problems have been associated with such conventional semiconductor integrated circuit apparatuses.

According to above Non-patent Document 1, there are at present major limitations in Adaptive Voltage Scaling technology. With current Adaptive Voltage Scaling technology, use of this technology for an entire chip is presupposed. In this case, the entire chip changes its power supply voltage and the corresponding system clock frequency simultaneously. That is to say, in this system, the chip's power supply voltage and system clock frequency vary on the time axis, and when the amount of additional work is large, the CPU performs control so that the chip's power supply voltage is raised (for example, VDD=1.5 Volt) and the system clock frequency is also raised (for example, fclk=400 MHz). Also, when the workload becomes smaller, the CPU performs control so that the chip's power supply voltage is lowered (for example, VDD=1.0 Volt) and the system clock frequency is also lowered (for example, fclk=200 MHz). By so doing, the power consumption expended by this chip can be reduced.

However, this system is not practical. As described above, there are normally various kinds of function blocks in a system. LSI, such as a video signal processing block, an audio signal processing block, and a control signal processing block, and furthermore, the workload necessary for this processing varies greatly among these function blocks.

The prior art that attempts to solve this problem includes above Non-patent Document 2. Here, the power supply voltage of the audio signal processing block can be selected from 0.9 V or 1.2 V, and the system clock frequency from 90 MHz or 180 MHz, while the power supply voltage and system clock frequency for blocks other than the audio signal processing block (including a video signal processing block and so forth) are fixed at 1.2 V and 180 MHz respectively.

The introduction of a dynamic de-skewing system (DDS) has been tried to enable the power supply voltage and system clock frequency of the audio signal processing block to be switched freely by means of CPU software control. That is to say, since system clock frequency skew occurs at 90 MHz/180 MHz due to switching of the audio signal processing block power supply voltage between 0.9 V and 1.2V, a dynamic de-skewing system (DDS) has been introduced as a countermeasure to this skew. However, the environment postulated in above Non-patent Document 2 in the prior art is far from a perspective of using Adaptive Voltage Scaling technology effectively for future low-power-consumption implementation.

To date, an effective method has not been proposed as to how to enable function blocks in semiconductor integrated circuit apparatus 40 such as postulated in FIG. 3 freely to vary power supply voltage and system clock frequency on the time axis, and also to exchange data among themselves.

The present invention has been implemented taking into account the points described above, and it is an object of the present invention to provide a semiconductor integrated circuit apparatus that enables function blocks in a semiconductor integrated circuit freely to vary power supply voltage and system clock frequency on the time axis, and also to exchange data among themselves.

SUMMARY OF THE INVENTION

It is an object of the present invention to provide a semiconductor integrated circuit apparatus that enables function blocks in a semiconductor integrated circuit freely to vary power supply voltage and system clock frequency on the time axis, and also to exchange data among themselves.

According to an aspect of the invention, a semiconductor integrated circuit apparatus is configured from: a first function block that has a first clock generation circuit that generates a first system clock supplied to circuitry in a function block, and first internal memory in which data is read/written by means of the first system clock; and a second function block that has a second clock generation circuit that generates a second system clock supplied to circuitry in a function block, and second internal memory in which data is read/written by means of the second system clock; wherein the first function block has a first selection section that selects the first system clock or the second system clock, and supplies that selected clock to the first internal memory.

DETAILED DESCRIPTION OF THE PREFERRED EMBODIMENTS

With reference now to the accompanying drawings, embodiments of the present invention will be explained in detail below.

Embodiment 1

Figure 1:
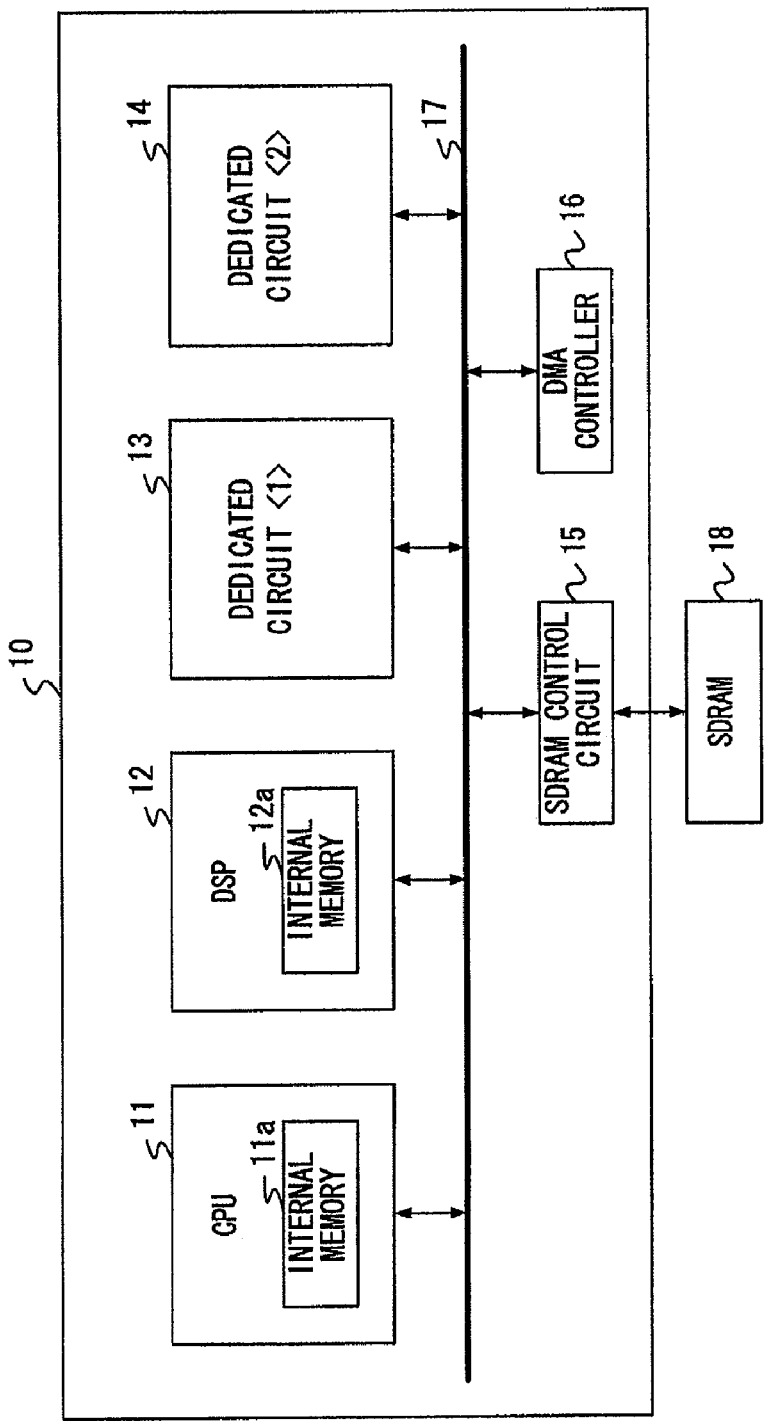
FIG. 1 is a block diagram of a conventional system LSI.
Figure 2:
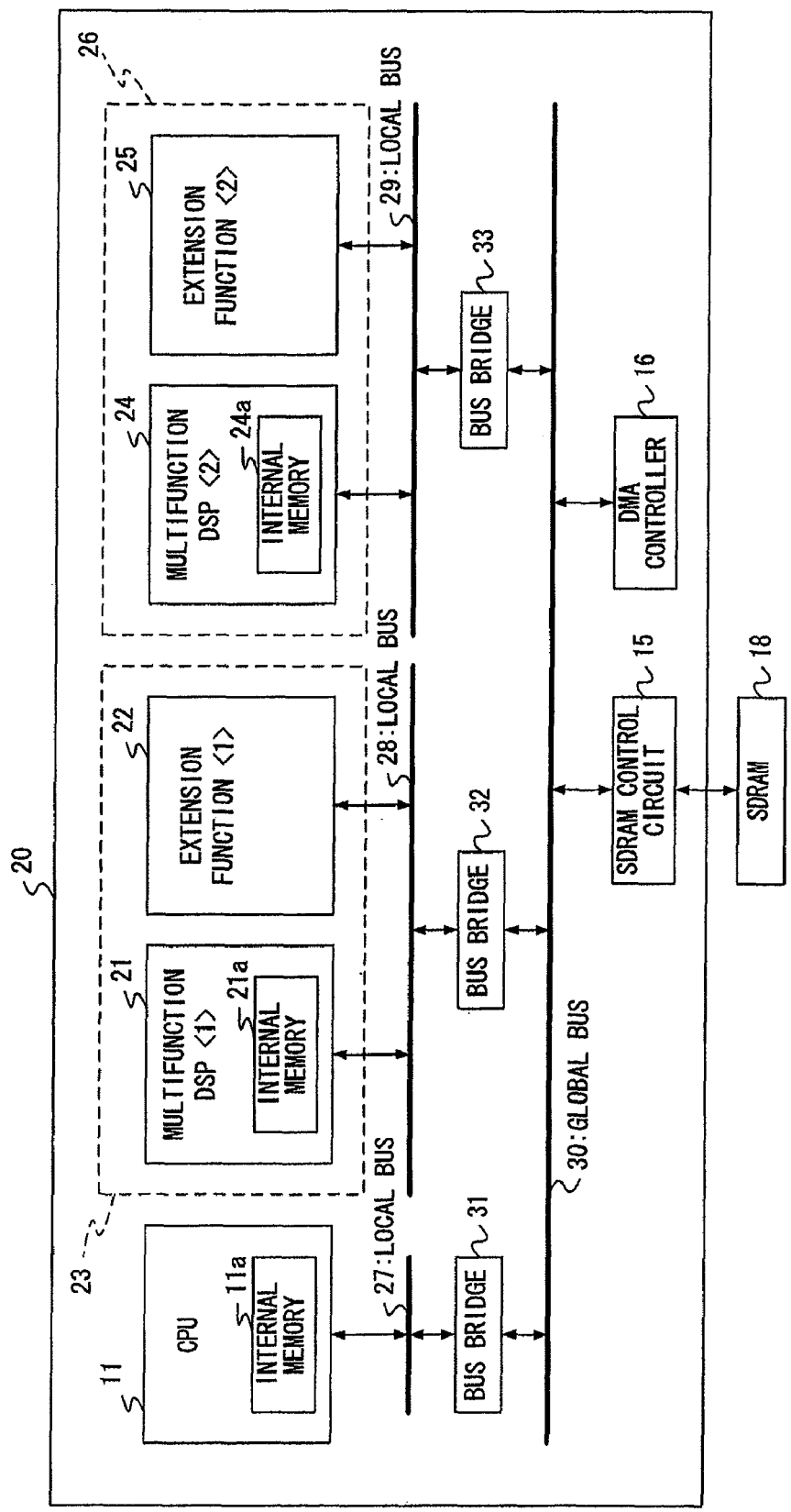
FIG. 2 is a block diagram of a conventional system LSI.
Figure 3:
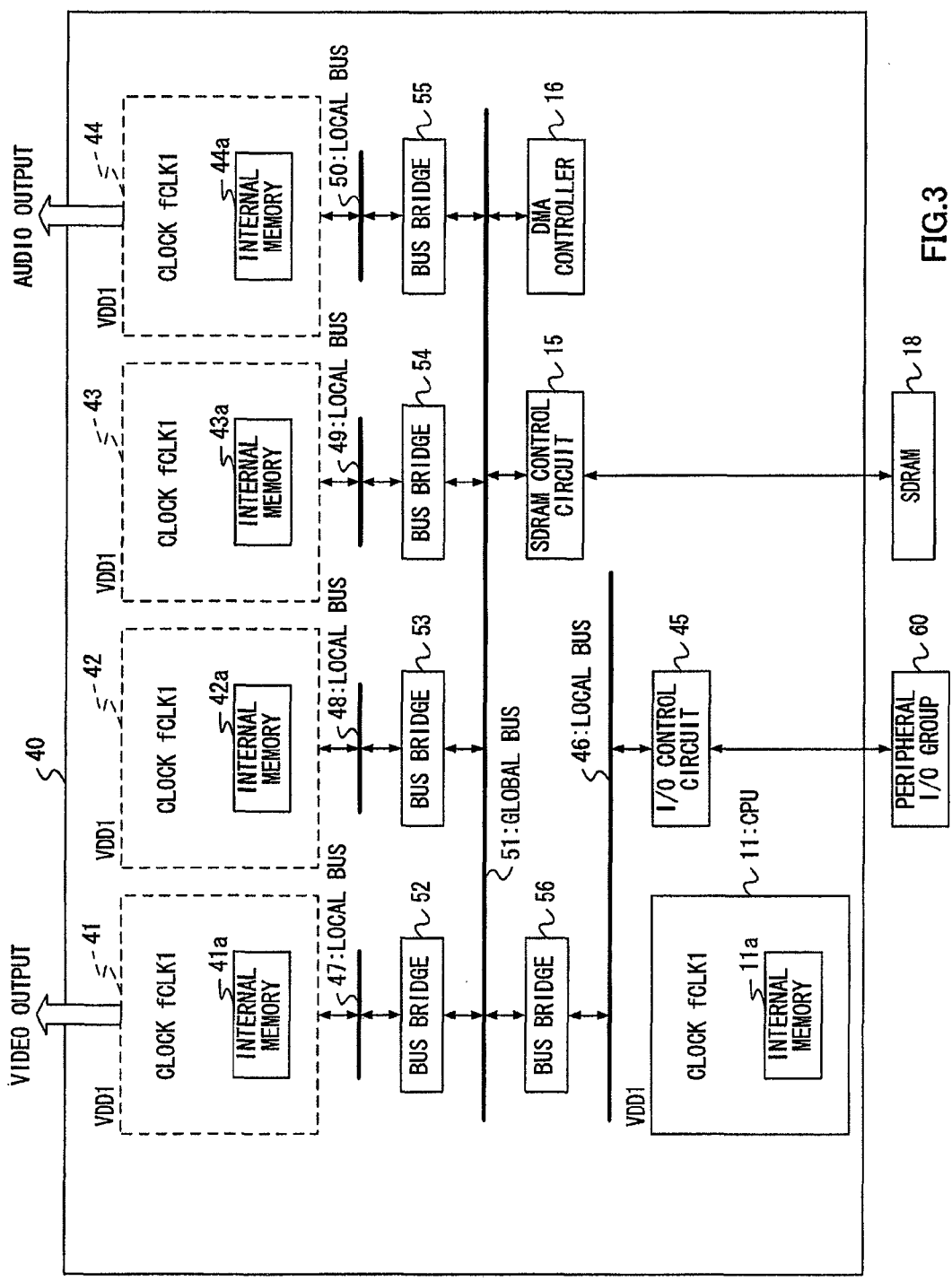
FIG. 3 is a block diagram of a conventional system LSI.
Figure 4:
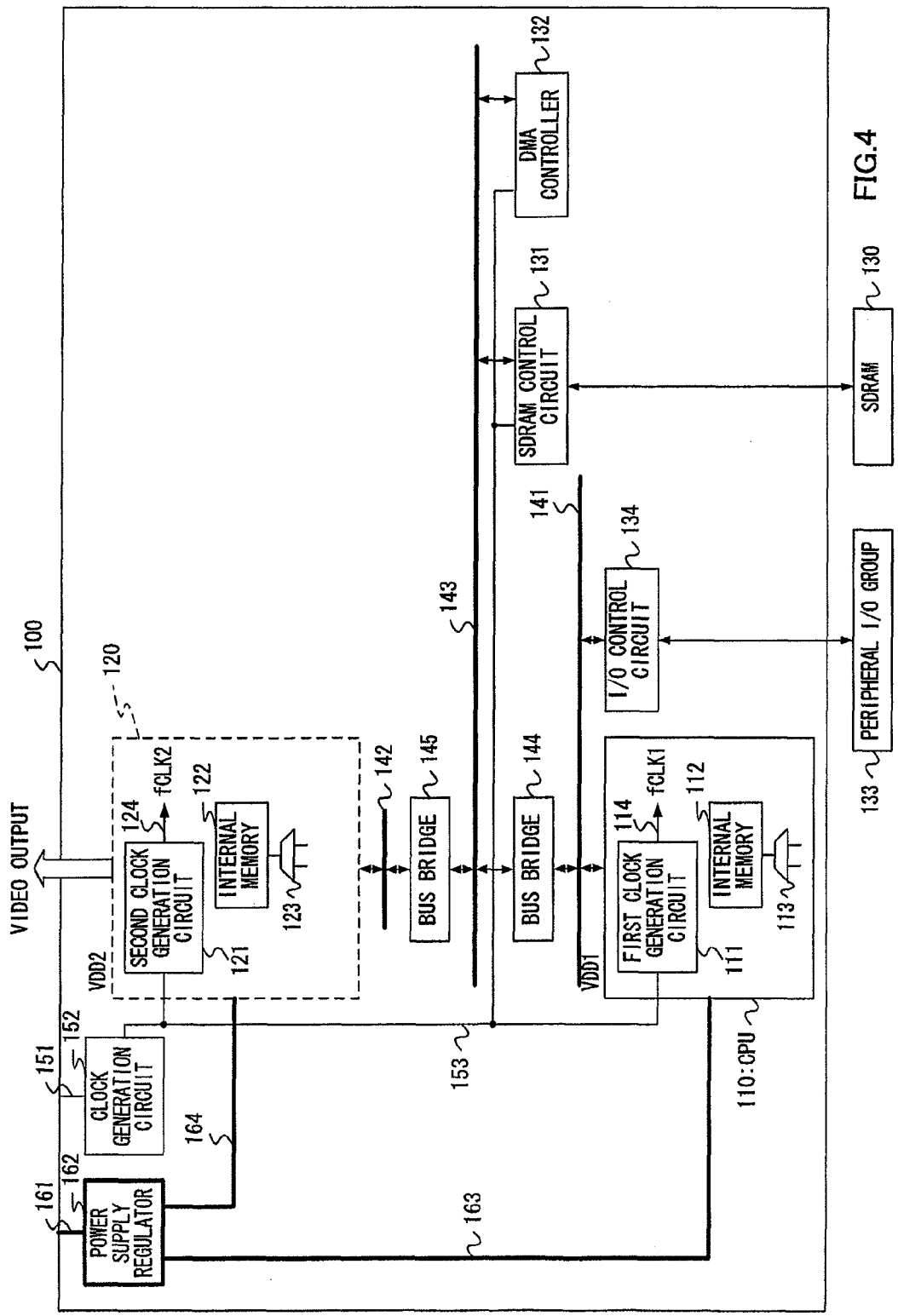
FIG. 4 is a block diagram showing the configuration of a semiconductor integrated circuit apparatus according to Embodiment 1 of the present invention.

FIG. 4 is a circuit block diagram showing the configuration of a semiconductor integrated circuit apparatus according to Embodiment 1 of the present invention. In this embodiment, a case is described in which function blocks in the semiconductor integrated circuit apparatus are limited to a first function block and a second function block. A general-purpose CPU is assumed for the first function block, and a multifunction DSP for the second function block.

In FIG. 4, a semiconductor integrated circuit apparatus 100 is configured by means of a first function block 110 assumed to be a general-purpose CPU, a second function block 120, an SDRAM control circuit 131 that controls SDRAM 130, a DMA controller 132, an I/O control circuit 134 that controls a peripheral I/O group 133, a local bus 141 located on the first function block 110 and I/O control circuit 134 side, a local bus 142 located on the second function block 120 side, a global bus 143 located between local bus 141 and local bus 142, a bus bridge 144 that connects local bus 141 to global bus 143, a bus bridge 145 that connects local bus 142 to global bus 143, a clock generation circuit 152 that generates a clock that is multiplied based on a clock 151 input from outside, and a power supply regulator 162 that supplies a predetermined power supply to each section based on an external power supply 161.

First function block 110 is configured by means of a first clock generation circuit 111 that generates a first system clock ($f_{CLK1}$) 114, first internal memory 112, and a selector 113 that selects either the first system clock or a second system clock and supplies the selected clock to first internal memory 112. Second function block 120 is configured by means of a second clock generation circuit 121 that generates a second system clock ($f_{CLK2}$) 124, second internal memory 122, and a selector 123 that selects either the first system clock or the second system clock and supplies the selected clock to second internal memory 122.

An example of the connections of above first internal memory 112 and second internal memory 122 will be illustrated later herein using FIG. 5, taking first internal memory 112 as an example.

Clock generation circuit 152 generates a system clock 153, and supplies generated system clock 153 to first clock generation circuit 111 in first function block 110, second clock generation circuit 121 in second function block 120, SDRAM control circuit 131, and DMA controller 132.

First system clock ($f_{CLK1}$) 114 supplied to circuitry in first function block 110 is generated by first clock generation circuit 111 in first function block 110, and second system clock ($f_{CLK2}$) 124 supplied to circuitry in second function block 120 is generated by second clock ($f_{CLK1}$) generation circuit 121 in second function block 120. Also, 114 generated by first clock generation circuit 111 in first function block 110 is also supplied to circuitry in second function block 120, and second system clock ($f_{CLK2}$) 124 generated by second clock generation circuit 121 in second function block 120 is also supplied to circuitry in first function block 110.

Power supply regulator 162 supplies a power supply 163 to first function block 110, and a power supply 164 to second function block 120.

In this embodiment, overall flow control relationships are incorporated in a main program stored in first internal memory 112 in first function block 110 that is assumed to be a general-purpose CPU, and AV related processing and the like requiring processing capability is incorporated in a subprogram stored in second internal memory 122 in second function block 120 that is assumed to be a multifunction DSP. In this sense, management of the overall work of the semiconductor integrated circuit apparatus is performed by first function block 110 that is assumed to be a general-purpose CPU.

Figure 5:
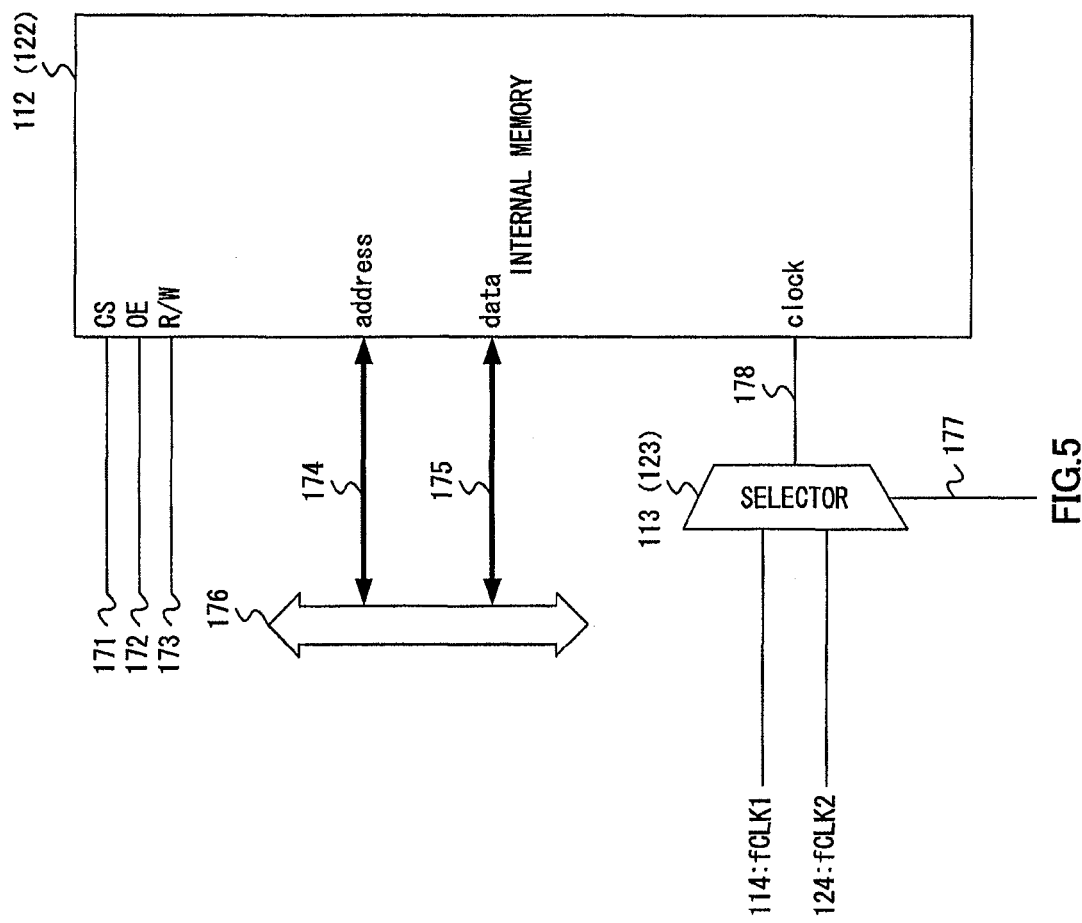
FIG. 5 is a drawing showing connections of internal memory in a function block of a semiconductor integrated circuit apparatus according to Embodiment 1.

FIG. 5 is a drawing showing connections of internal memory in a function block. As first internal memory 112 in first function block 110 and second internal memory 122 in second function block 120 have identical configurations, the description will refer to first internal memory 112 as a representative example.

In FIG. 5, reference code 112 denotes internal memory in first function block 110, reference code 171 denotes a chip select (C/S) signal, reference code 172 denotes an output enable (OE) signal, reference code 173 denotes a read/write (R/W) signal, reference code 174 denotes an address signal, reference code 175 denotes a data signal, reference code 176 denotes a local bus, reference code 114 denotes a first system clock supplied to circuitry in first function block 110, reference code 124 denotes a second system clock supplied to circuitry in second function block 120, reference code 113 denotes a selector, reference code 177 denotes a selector 113 control signal, and reference code 178 denotes a clock that is either first system clock 114 supplied to circuitry in first function block 110 or second system clock 124 supplied to circuitry in second function block 120, selected by means of selector 113 control signal 177.

As system clock 178 supplied to first internal memory 112 in first function block 110, a signal that is either first system clock 114 supplied to circuitry in first function block 110 or second system clock 124 supplied to circuitry in second function block 120 is selected by means of selector 113 control signal 177.

Figure 6:
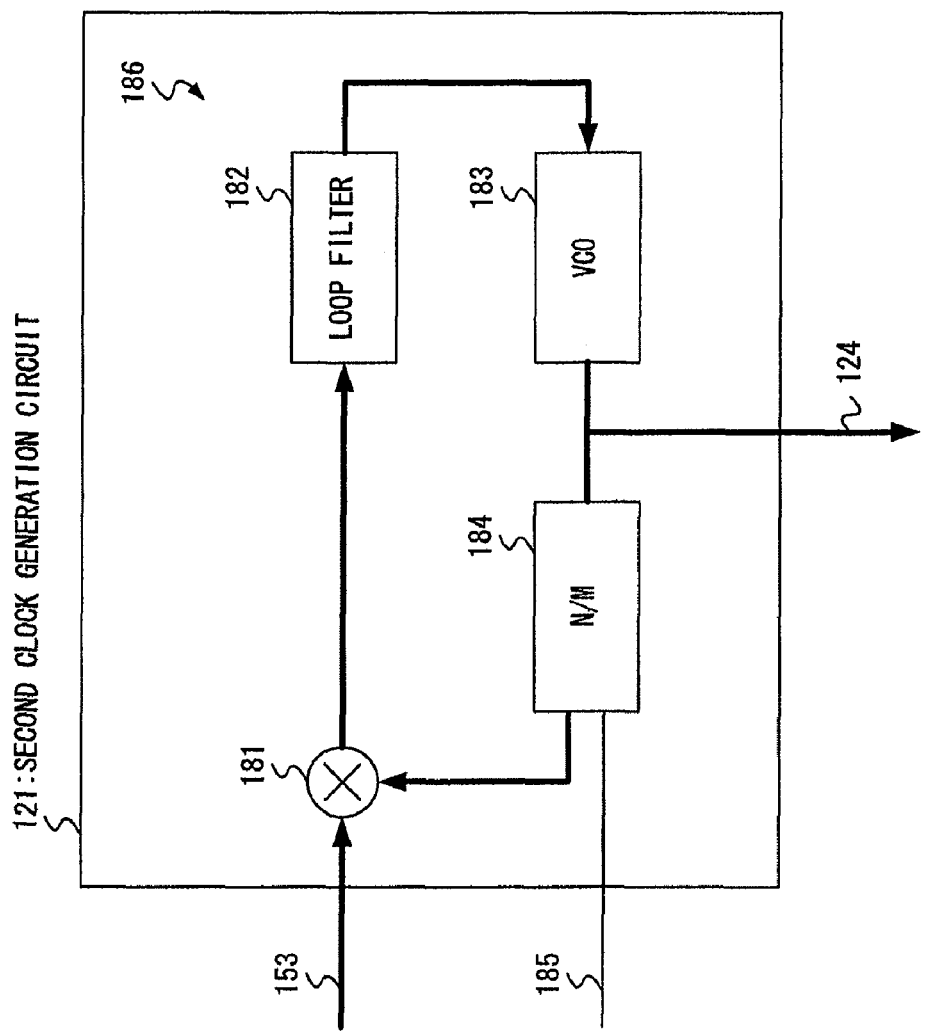
FIG. 6 is a block diagram of a second clock generation circuit in a second function block of a semiconductor integrated circuit apparatus according to Embodiment 1.

FIG. 6 is a block diagram showing the configuration of second clock generation circuit 121 in second function block 120.

In FIG. 6, second clock generation circuit 121 is configured by means of a phase detector 181 that performs phase comparison between system clock 153 generated by clock generation circuit 152 and frequency division circuit output, a loop filter 182, a VCO (Voltage Controlled Oscillator) 183, and a frequency division circuit 184 that performs N/M division (where M>N) of the frequency of an output signal from VCO 183. Reference code 185 denotes a control signal from first function block 110 that is assumed to be a general-purpose CPU, and reference code 124 denotes the second system clock generated by second clock generation circuit 121 in second function block 120.

Second clock generation circuit 121 forms a PLL (Phase-Locked Loop) circuit 186, and generates second system clock 124 synchronized with system clock 153 generated by clock generation circuit 152. The operating frequency of second system clock 124 can be set to a desired frequency by means of control signal 185 from first function block 110 that is assumed to be a general-purpose CPU. For example, if the frequency of system clock 153 generated by clock generation circuit 152 is designated $f_{CLX\_153}$, the frequency of second system clock 124 synchronized with system clock 153 generated by clock generation circuit 152 is designated $f_{CLK\_124}$, and the division ratio of the frequency of the output signal from VCO 183 set by means of control signal 185 from first function block 110 that is assumed to be a general-purpose CPU is designated N/M, then the following relationships hold true:

$$f_{CLK\_124} \times N/M = f_{CLK\_153} \qquad (1)$$

and therefore:

$$f_{CLK\_124} = f_{CLK\_153} \times M/N \qquad (2)$$

By means of the above kind of method, second system clock 124 synchronized with system clock 153 generated by clock generation circuit 152 can be freely controlled by second clock generation circuit 121 by means of control signal 185 from first function block 110 that is assumed to be a general-purpose CPU.

Figure 7:
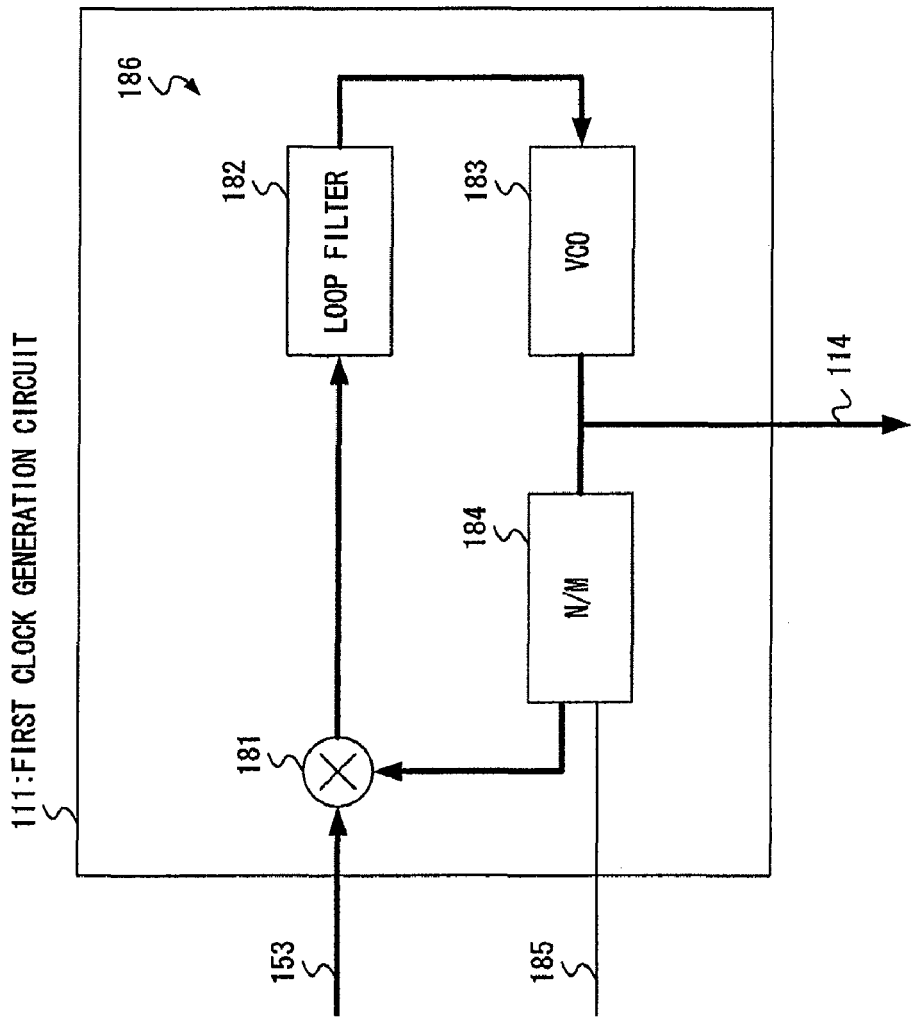
FIG. 7 is a block diagram of a first clock generation circuit in a first function block of a semiconductor integrated circuit apparatus according to Embodiment 1.

FIG. 7 is a block diagram showing the configuration of first clock generation circuit 111 in first function block 110. Configuration parts identical to those in FIG. 6 are assigned the same codes as in FIG. 6.

First clock generation circuit 111 has the same kind of configuration as second clock generation circuit 121, except that control signal 185 from first function block 110 in second clock generation circuit 121 is a signal from within its own block.

To summarize the above relationships, by means of first clock generation circuit 111 in first function block 110, first system clock 114 necessary for performing an amount of computational processing that varies depending on the time axis of first function block 110 is generated from system clock 153 of semiconductor integrated circuit apparatus 100 using first clock generation circuit 111, and by means of second clock generation circuit 121 in second function block 120, second system clock 124 necessary for performing an amount of computational processing that varies depending on the time axis of second function block 120 is generated from system clock 153 of semiconductor integrated circuit apparatus 100 using second clock generation circuit 121.

First function block 110 that is a general-purpose CPU has large-capacity first internal memory 112, and this first function block 110 controls the overall operation of semiconductor integrated circuit apparatus 100. In this embodiment, an actual schedule of what kind of work second function block 120 performs in what order is held in program form in large-capacity first internal memory 112, and information is also held as to what processing capability is necessary for second function block 120 to perform what amount of work from what time in the course of executing that program, what frequency second function block 120 is to operate at for that purpose, and what power supply voltage second function block 120 must operate at in order to operate at that operating frequency.

The operation of semiconductor integrated circuit apparatus 100 configured as described above will now explained.

Figure 8:
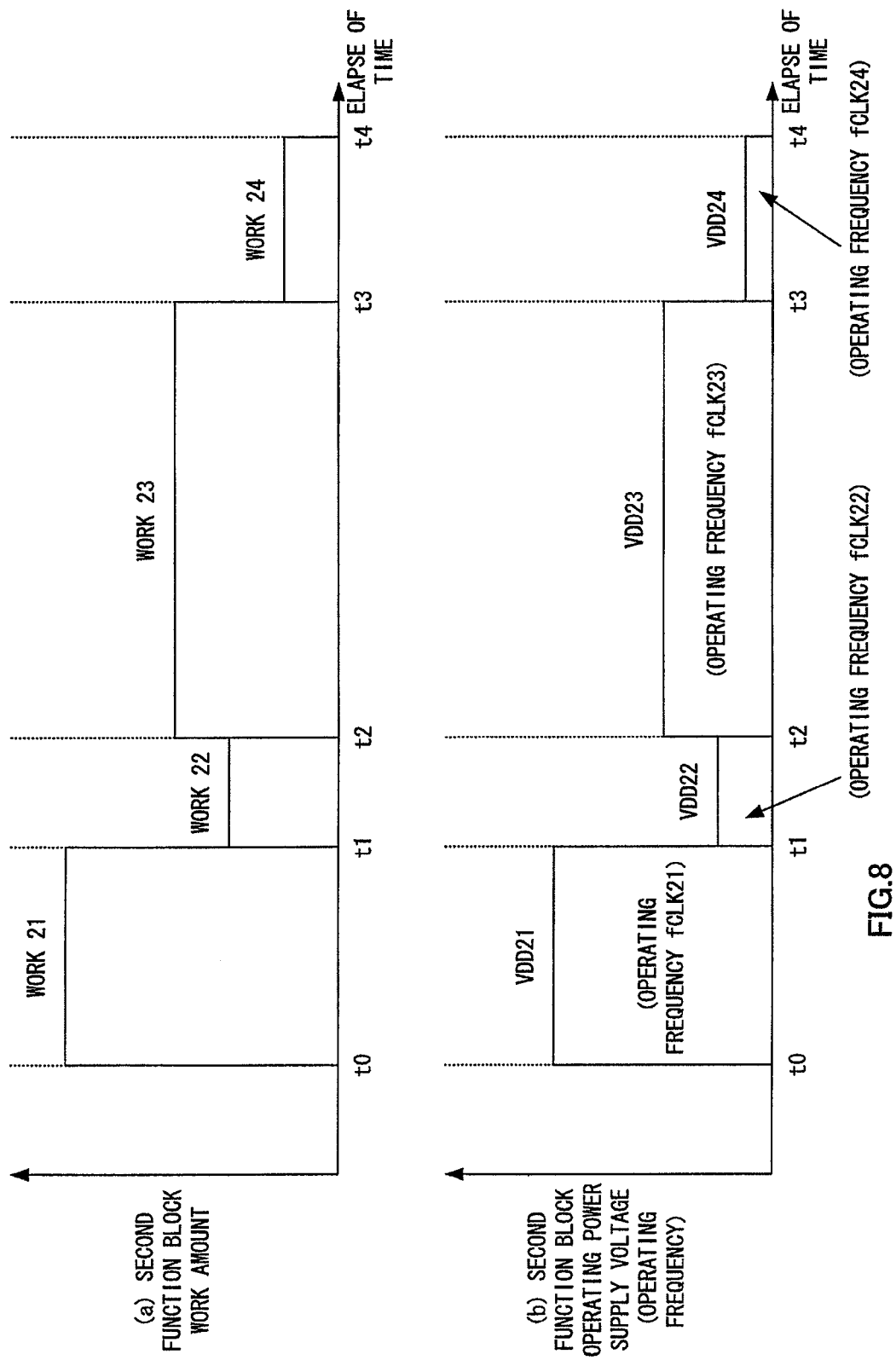
FIG. 8 is a drawing showing the dependency overtime between the amount of work of a second function block and the power supply voltage (operating frequency) of the second function block of a semiconductor integrated circuit apparatus according to Embodiment 1.
Figure 9:
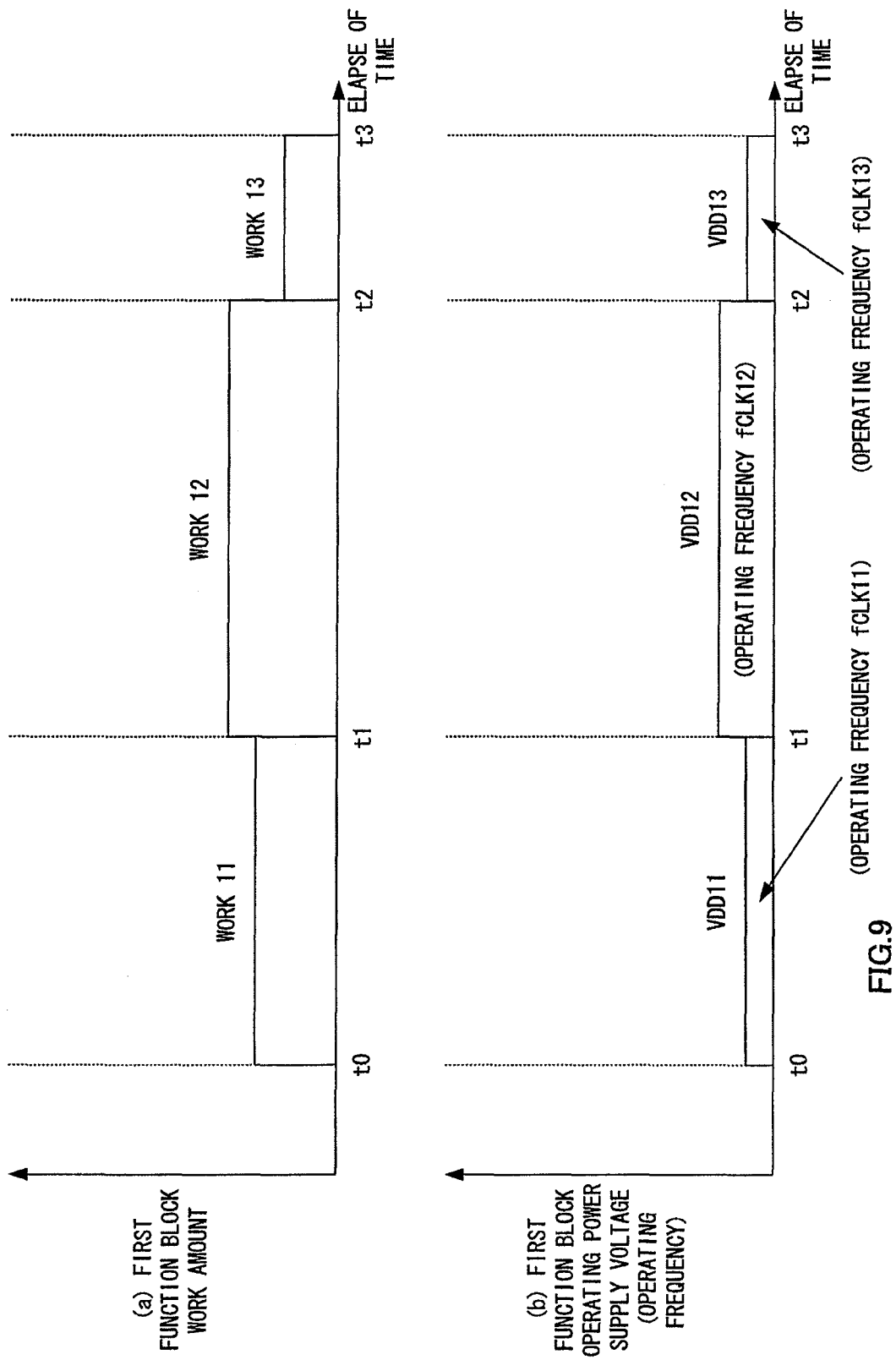
FIG. 9 is a drawing showing the dependency over time between the amount of work of a first function block and the power supply voltage (operating frequency) of the first function block of a semiconductor integrated circuit apparatus according to Embodiment 1 of the present invention.

FIG. 8 is a drawing showing the dependency over time between the amount of work of second function block 120 and the power supply voltage (operating frequency) of second function block 120, and FIG. 9 is a drawing showing the dependency over time between the amount of work of first function block 110 and the power supply voltage (operating frequency) of first function block 110.

As shown in the examples of second function block 120 work amount in FIG. 8(a) and second function block 120 operating power supply voltage in FIG. 8(b), a work schedule whereby second function block 120 performs work 21 from time t0 to time t1 at a power supply voltage VDD21 and operating frequency $f_{CLK21}$, performs work 22 from time t1 to time t2 at a power supply voltage VDD22 and operating frequency $f_{CLK22}$, performs work 23 from time t2 to time t3 at a power supply voltage VDD23 and operating frequency $f_{CLK23}$ and performs work 24 from time t3 to time t4 at a power supply voltage VDD24 and operating frequency $f_{CLK24}$, is managed in first internal memory 112 of first function block 110 that is a general-purpose CPU.

As shown in the examples of first function block 110 work amount in FIG. 9(a) and first function block 110 operating power supply voltage in FIG. 9(b), a work schedule whereby first function block 110 performs work 11 from time t0 to time t1 at a power supply voltage VDD11 and operating frequency $f_{CLK11}$, performs work 12 from time t1 to time t2 at a power supply voltage VDD12 and operating frequency $f_{CLK12}$, and performs work 13 from time t2 to time t3 at a power supply voltage VDD13 and operating frequency $f_{CLK13}$, is managed in first internal memory 112 of first function block 110 itself.

As can be seen by comparing FIG. 8 and FIG. 9, the frequency of first system clock 114 generated by first clock generation circuit 111 in first function block 110 and supplied to circuitry in first function block 110 is determined depending on the amount of computational processing of work performed in first function block 110, and the frequency of second system clock 124 generated by second clock generation circuit 121 in second function block 120 and supplied to circuitry in second function block 120 is determined depending on the amount of computational processing of work performed in second function block 120. Therefore, there is no clear correlation between the frequency of first system clock 114 generated by first clock generation circuit 111 in first function block 110 and supplied to circuitry in first function block 110, and the frequency of second system clock 124 generated by second clock generation circuit 121 in second function block 120 and supplied to circuitry in second function block 120.

Consequently, in this embodiment, the configuration illustrated in FIG. 5 is used as the structure of internal memory in function blocks in semiconductor integrated circuit apparatus 100 shown in FIG. 4. By using this configuration, even if there is no clear correlation between the frequency of first system clock 114 generated by first clock generation circuit 111 in first function block 110 and supplied to circuitry in first function block 110, and the frequency of second system clock 124 generated by second clock generation circuit 121 in second function block 120 and supplied to circuitry in second function block 120, when, between first function block 110 and second function block 120, the internal memory of the other function block is not being used by the circuitry of the other function block, it is possible for data in the internal memory of the other function block to be read freely, and data in a function block to be written to the internal memory in the other function block.

Next, operations will be described in greater detail with reference to connection diagrams of internal memories 112 and 122 in first function block 110 and second function block 120.

Figure 10:
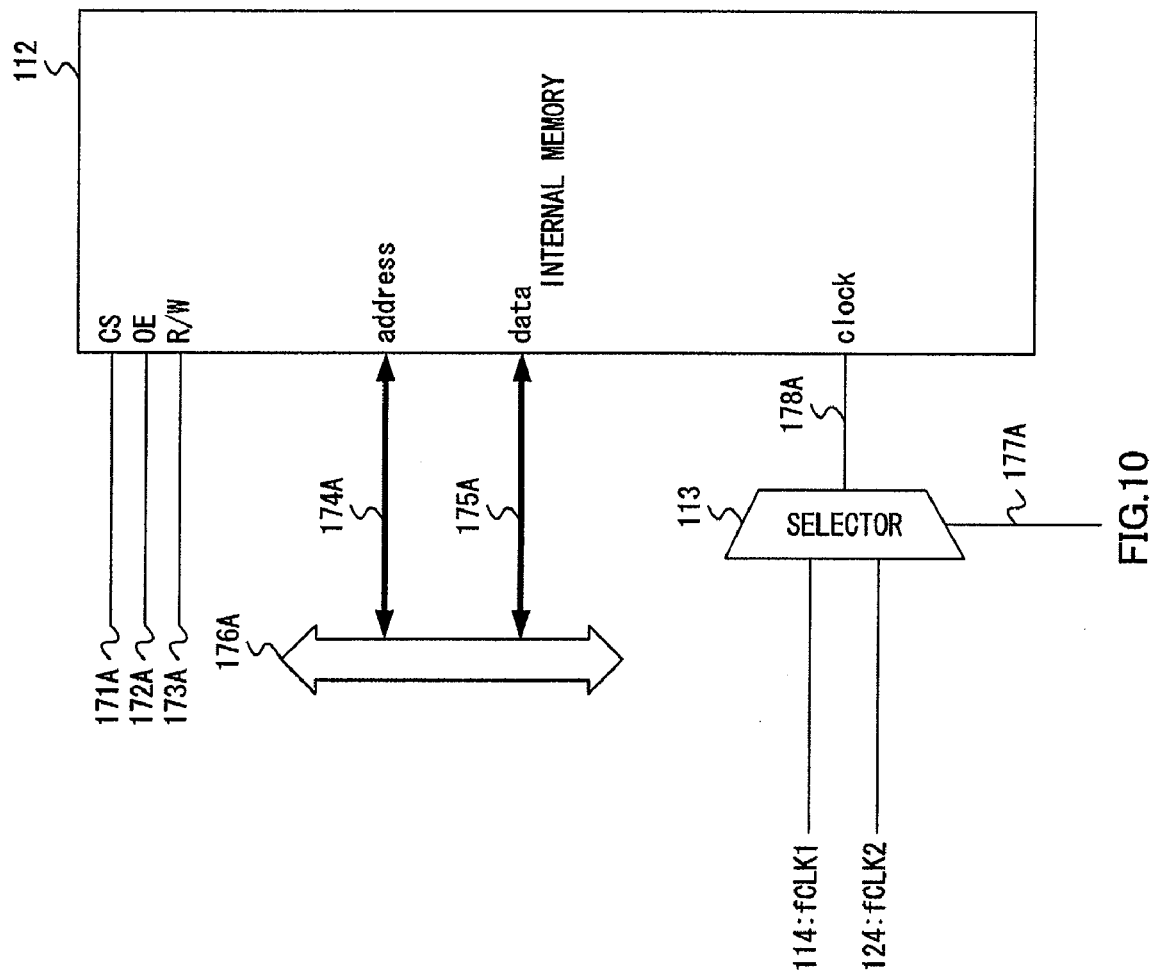
FIG. 10 is a connection diagram of internal memory in a first function block of a semiconductor integrated circuit apparatus according to Embodiment 1.

FIG. 10 is a drawing showing connections of first internal memory 112 in first function block 110 described above, and FIG. 11 is a drawing showing connections of second function block 120 in second function block 120 described above.

In FIG. 10, reference code 112 denotes first internal memory in first function block 110 (internal memory <1>), reference code 171A denotes a chip select signal, reference code 172A denotes an output enable signal, reference code 173A denotes a read/write signal, reference code 174A denotes an address signal, reference code 175A denotes a data signal, reference code 176A denotes a local bus, reference code 114 denotes a first system clock supplied to circuitry in first function block 110, reference code 124 denotes a second system clock supplied to circuitry in second function block 120, reference code 113 denotes a selector, reference code 177A denotes a selector 113 control signal, and reference code 178A denotes a system clock signal that is either first system clock 114 supplied to circuitry in first function block 110 or second system clock 124 supplied to circuitry in second function block 120, selected by means of selector 113 control signal 177A.

Figure 11:
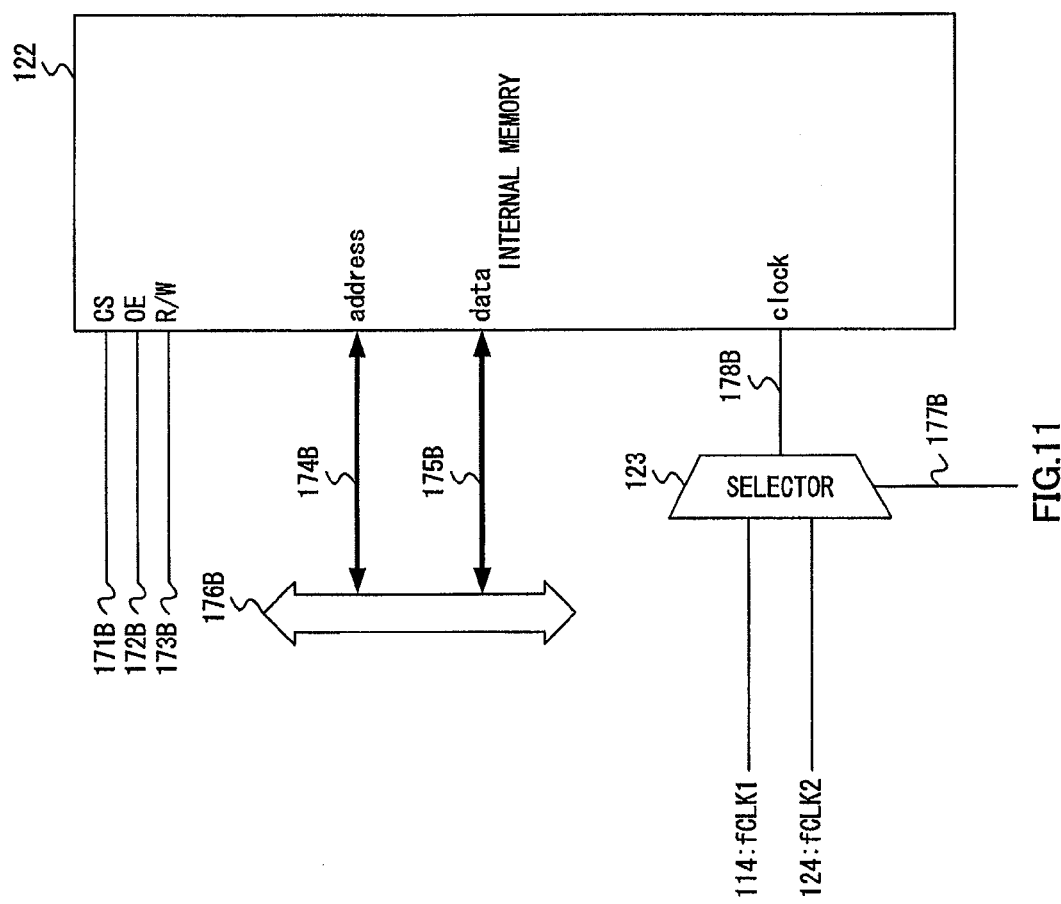
FIG. 11 is a drawing showing connections of internal memory in a function block of a semiconductor integrated circuit apparatus according to Embodiment 1.

In FIG. 11, reference code 122 denotes second internal memory in second function block 120 (internal memory <2>), reference code 171B denotes a chip select signal, reference code 172B denotes an output enable signal, reference code 173B denotes a read/write signal, reference code 174B denotes an address signal, reference code 175B denotes a data signal, reference code 176B denotes a local bus, reference code 114 denotes a first system clock supplied to circuitry in first function block 110, reference code 124 denotes a second system clock supplied to circuitry in second function block 120, reference code 123 denotes a selector, reference code 177B denotes a selector 123 control signal, and reference code 178B denotes either first system clock 114 supplied to circuitry in first function block 110 or second system clock 124 supplied to circuitry in second function block 120, selected by means of selector 123 control signal 177B.

[Operation to Write a Data Signal in First Function Block 110 to Second Internal Memory 122 in Second Function Block 120]

When it is wished to write a data signal in first function block 110 to second internal memory 122 in second function block 120, referring to FIG. 11, after confirming that second internal memory 122 in second function block 120 is not being used by circuitry in second function block 120, selector 123 control signal 177B is controlled and a setting is made so that first system clock 114 supplied to circuitry in first function block 110 is selected as signal 178B, chip select signal 171B is set to "H", read/write signal 173B is set to "write state", and address 174B of second internal memory 122 in second function block 120 is set. Then bus bridge 144 and bus bridge 145 shown in FIG. 4 are controlled so that a data signal in first function block 110 is sent to data signal 175B (see FIG. 11) of second internal memory 122 in second function block 120 via local bus 141, global bus 143, and local bus 142, and is then written to second internal memory 122 in second function block 120.

[Operation to Read a Data Signal of Second Internal Memory 122 in Second Function Block 120 into First Internal Memory 112 in First Function Block 110]

When reading a data signal of second internal memory 122 in second function block 120 into first function block 110, referring to FIG. 11, after confirming that second internal memory 122 in second function block 120 is not being used by circuitry in second function block 120, selector 123 control signal 177B is controlled and a setting is made so that first system clock 114 supplied to circuitry in first function block 110 is selected as signal 178B, chip select signal 171B is set to "H", read/write signal 173B is set to "read state", and address 174B of second internal memory 122 in second function block 120 is set to an address of an area to be read. Then bus bridge 144 and bus bridge 145 shown in FIG. 4 are controlled so that a data signal stored in second internal memory 122 in second function block 120 is read into first function block 110 via local bus 142, global bus 143, and local bus 141.

Read/write operations on second internal memory 122 in second function block 120 have been described above, but the same kind of operations can also be used when it is wished to write a data signal in second function block 120 to first internal memory 112 in first function block 110, or to read a data signal of first internal memory 112 in first function block 110 into second internal memory 122 in second function block 120.

The way in which first function block 110 controls the power supply voltage and operating frequency of second function block 120 will now be explained in detail.

What kind of work second function block 120 performs is described in the form of an operation program in first internal memory 112 in first function block 110. First function block 110 reads that second function block 120 executes work 21 from time t0 (see FIG. 8) according to this operation program. Then operating voltage VDD21, operating frequency $f_{CLK21}$, and M/N in above Equation (2), corresponding to that work 21 are read from a Table 1.

TABLE 1

| Work contents | Power supply voltage | Operating frequency | M/N |
|---|---|---|---|
| Work 11 | VDD11 | $f_{CLK11}$ | 4 |
| Work 12 | VDD12 | $f_{CLK12}$ | 3 |
| Work 13 | VDD13 | $f_{CLK13}$ | 5 |
| Work 14 | VDD14 | $f_{CLK14}$ | 2 |
| Work 15 | VDD15 | $f_{CLK15}$ | 2 |
| Work 16 | VDD16 | $f_{CLK16}$ | 5 |
| Work 17 | VDD17 | $f_{CLK17}$ | 3 |
| Work 18 | VDD18 | $f_{CLK18}$ | 7 |
| Work 19 | VDD19 | $f_{CLK19}$ | 6 |
| Work 21 | VDD21 | $f_{CLK21}$ | 15 |
| Work 22 | VDD22 | $f_{CLK22}$ | 9 |
| Work 23 | VDD23 | $f_{CLK23}$ | 23 |
| Work 24 | VDD24 | $f_{CLK24}$ | 13 |
| Work 25 | VDD25 | $f_{CLK25}$ | 21 |
| Work 26 | VDD26 | $f_{CLK26}$ | 8 |
| Work 27 | VDD27 | $f_{CLK27}$ | 18 |
| Work 28 | VDD28 | $f_{CLK28}$ | 7 |
| Work 29 | VDD29 | $f_{CLK29}$ | 11 |

This Table 1 is decided upon based on a prior investigation of the respective work contents contained in an operation program, determination of what kind of operating frequency is necessary when the respective items of work are performed by the multifunction DSP of second function block 120, and a thorough simulation as to what kind of power supply voltage it is necessary to set for that purpose.

Then, firstly, first function block 110 directs on-chip power supply regulator 162 to supply power supply voltage VDD2 to second function block 120.

Next, first function block 110 writes an appropriate actual value of M/N to a circuit that performs N/M division (where M>N) of the frequency of an output signal from VCO 183 of second clock gene ration circuit 121 via control signal 185 shown in FIG. 6. Second clock generation circuit 121 is set to a stable operating frequency $f_{CLK2}$ after the elapse of the PLL circuit 186 setup time. As the time required for the above setting is very short compared with the time required for work 21, it is not shown in FIG. 8.

After the time necessary for second function block 120 power supply voltage VDD2 and operating frequency $f_{CLK2}$ to stabilize has elapsed, first function block 110 permits second function block 120 to start work 21, and therefore second function block 120 starts work 21.

When work 21 is completed, second function block 120 reports "work 21 completed information" to first function block 110 that manages all work. Of course, an arrangement may also be used whereby, instead of reporting "work 21 completed information" to first function block 110 that manages all work when work 21 is completed, second function block 120 records "work 21 completed information" as a flag in a specific register, and first function block 110 takes a looks at that register.

The way in which the above-described functions of this apparatus are implemented will now be explained in detail.

In order for second function block 120 to execute work 23, data stored in a particular area of internal memory 112 of first function block 110 is necessary. In this case, before executing work 23, second function block 120 must first transfer data stored in a particular area of internal memory 112 of first function block 110 to an appropriate area of its own internal memory 122. It is necessary for first function block 110 that manages all work to control this work. First function block 110 executes this work within work 11. At this time, in the case of work 22 that does not use resources related to second internal memory 122, second function block 120 can perform parallel execution.

As first function block 110 operates at operating and second function block 120 operates at operating frequency $f_{CLK22}$, synchronization cannot be achieved, and is has not previously been possible for data stored in a particular area of internal memory 112 of first function block 110 to be transferred to an appropriate are a of internal memory 122 of second function block 120. In this embodiment, however, this problem has been solved by configuring internal memory 122 of second function block 120 as shown in FIG. 5.

That is to say, as illustrated in FIG. 11, when it is wished to write a data signal in first function block 110 to internal memory 122 in second function block 120, it is first confirmed that internal memory 122 in second function block 120 is not being used by circuitry in second function block 120. In this embodiment, since a main program in which is written what programs are to be executed in what order by semiconductor integrated circuit apparatus 10 overall is located in internal memory 112 in first function block 110, basically second function block 120 does not use internal memory 122 unless so directed by first function block 110. However, since there are cases in which there may be a possibility of second function block 120 operating under a local program stored in internal memory 122 of second function block 120, a configuration is used whereby second function block 120 sends first function block 110 information as to whether or not it is using resources related to internal memory between changes of work. Since each function block has a multipurpose storage area such as a register file in addition to internal memory, processing that uses a register file and external memory effectively without occupying internal memory related resources is perfectly possible.

After confirming that internal memory 122 in second function block 120 is not being used by circuitry in second function block 120, selector 123 control signal 177B is controlled and a setting is made so that first system clock 114 supplied to circuitry in first function block 110 is selected as control signal 178B. Chip select signal 171B is set to "L" so that internal memory 122 (internal memory <2>) in second function block 120 is not rewritten by means of an operation during this time. That is to say, the chip select signal is set to "L" and internal memory 112 (internal memory <1>) is placed in the non-selected state so that the contents of internal memory 112 (internal memory <1>) are not rewritten when system clock 178 connected to internal memory 112 (internal memory <1>) is changed.

After the above setting operation ends, the chip select signal is set to "H", read/write signal 173B is set to "write state", address 174B of internal memory 122 (internal memory <2>) in second function block 120 is set, and bus bridges 144 and 145 are controlled so that a data signal in first function block 110 is sent to data signal 175B of internal memory 122 in second function block 120 via local bus 141, global bus 143, and local bus 142, and is then written to internal memory 122 (internal memory <2>) in second function block 120. If, during this time, second function block 120 is performing parallel execution of work 22 that does not use resources related to internal memory 122 (internal memory <2>), when work 22 is completed, second function block 120 reports "work 22 completed information" to first function block 110 that manages all work.

Next, first function block 110 reads that second function block 120 executes work 23 from time t2 according to the above-described operation program. Operating voltage VDD23, operating frequency $f_{CLK23}$, and M/N in Equation (2), corresponding to that work 23 are read from Table 1 recorded in another specific area of the operation program. Then, firstly, first function block 110 directs on-chip power supply regulator 162 to supply power supply voltage VDD3 to second function block 120.

Next, first function block 110 writes an appropriate actual value of M/N to a circuit that performs N/M division (where M>N) of the frequency of an output signal from VCO 183 of second clock generation circuit 121 via control signal 185 shown in FIG. 6. Second clock generation circuit 121 is set to a stable operating frequency $f_{CLK23}$ after the elapse of the PLL circuit 186 setup time.

After the time necessary for second function block 120 power supply voltage VDD23 and operating frequency $f_{CLK23}$ to stabilize has elapsed, second function block 120 permits the start of work 23, and on receiving this permission, second function block 120 starts work 23.

A case has been described in which a data signal in first function block 110 is written to internal memory 122 in second function block 120, but the contents are basically the same for a case in which a data signal in second function block 120 is read into internal memory 112 in first function block 110, and there fore a description of this case is omitted here.

A case has been described above in which first function block 110 takes the initiative, and writes a data signal in first function block 110 to internal memory 122 in second function block 120. As internal memory 112 in first function block 110 and internal memory 112 in second function block 120 have the same configuration, it is also possible for second function block 120 to take the initiative, and write a data signal in second function block 120 to internal memory 112 in first function block 110. However, since it is assumed in this embodiment that first function block 110 is a general-purpose CPU and second function block 120 is a multifunction DSP, although the general-purpose CPU comprising first function block 110 ultimately manages the operation of semiconductor integrated circuit apparatus 100 overall in this embodiment, the operation of semiconductor integrated circuit apparatus 100 overall is given a degree of freedom by providing a configuration whereby, only for a certain period during operation, second function block 120 can take the initiative, and write a data signal in second function block 120 to internal memory 112 in first function block 110.

As described in detail above, according to this embodiment, a semiconductor integrated circuit apparatus 100 has a first function block 110 assumed to be a general-purpose CPU and a second function block 120 comprising a multifunction DSP; first function block 110 has a first clock generation circuit 111 that generates a first system clock supplied to circuitry in a function block, first internal memory 112 in which data is read/written by means of the first system clock, and a selector 113 that selects the first system clock or a second system clock, and supplies that selected system clock to first internal memory 112; second function block 120 has a second clock generation circuit 121 that generates a second system clock supplied to circuitry in a function block, second internal memory 122 in which data is read/written by means of the second system clock, and a selector 123 that selects the first system clock or a second system clock, and supplies that selected system clock to second internal memory 122; one clock selected by selector 113 from the first system clock and the second system clock is supplied in the clock supplied to first internal memory 112; and one clock selected by selector 123 from the first system clock and the second system clock is supplied in the clock supplied to second internal memory 122. By this means, both the first function block and second internal memory in the second function block in which data is read and written operate on the first system clock supplied to circuitry in the first function block, and therefore the first function block and the second internal memory in the second function block are completely synchronized. Therefore, in semiconductor integrated circuit apparatus 100, it is possible for data to be transferred between the function blocks even if the respective function blocks change power supply voltage and system clock frequency freely according to the function block load using Dynamic Voltage Scaling technology or Adaptive Voltage Scaling technology.

Thus, it is possible for data to be transferred between the function blocks even if the respective function blocks change power supply voltage and system clock frequency freely according to the function block load using Dynamic Voltage Scaling technology or Adaptive Voltage Scaling technology, and flexible data transfer can be implemented between function blocks in a semiconductor integrated circuit, and in particular, a semiconductor integrated circuit suitable for low-power-consumption implementation using Dynamic Voltage Scaling (DVS) or Adaptive Voltage Scaling (AVS) technology. By this means, this system LSI can achieve low power consumption by making maximum use of Dynamic Voltage Scaling technology or Adaptive Voltage Scaling technology.

Embodiment 2

Figure 12:
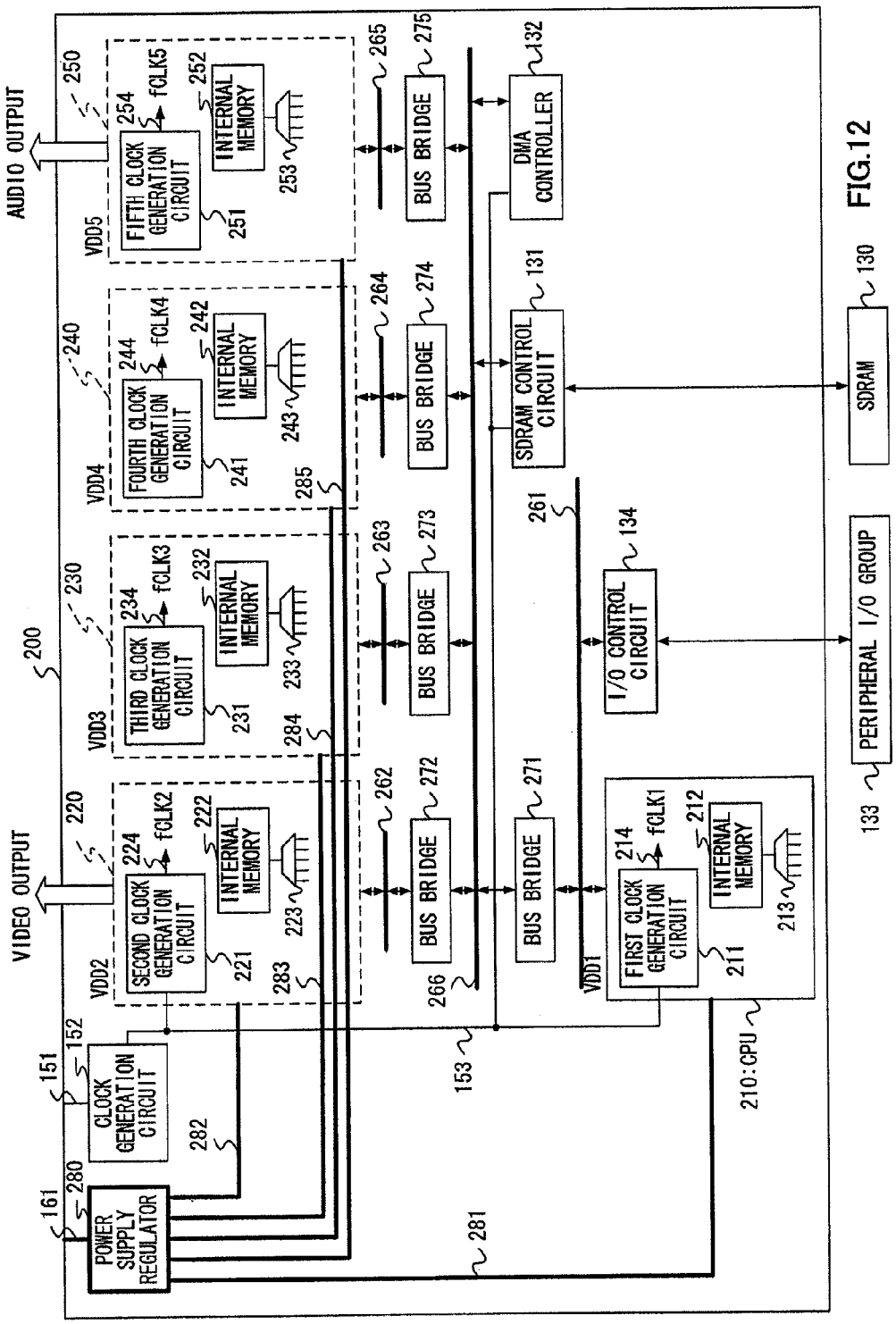
FIG. 12 is a block diagram showing the configuration of a semiconductor integrated circuit apparatus according to Embodiment 2 of the present invention.

FIG. 12 is a circuit block diagram showing the configuration of a semiconductor integrated circuit apparatus according to Embodiment 2 of the present invention. This embodiment is an example in which internal memory in a function block is applied to a semiconductor integrated circuit that has five function blocks. Configuration parts identical to those in FIG. 4 are assigned the same codes as in FIG. 4.

In FIG. 12, a semiconductor integrated circuit apparatus 200 is configured by means of a first function block 210 assumed to be a general-purpose CPU, a second function block 220, a third function block 230, a fourth function block 240, a fifth function block 250, an SDRAM control circuit 131 that controls SDRAM 130, a DMA controller 132, an I/O control circuit 134 that controls a peripheral I/O group 133, a local bus 261 located on the first function block 210 and I/O control circuit 134 side, a local bus 262 located on the second function block 220 side, a local bus 263 located on the third function block 230 side, a local bus 264 located on the fourth function block 240 side, a local bus 265 located on the fifth function block 250 side, a global bus 266 located between local bus 261 and local buses 262 through 265, a bus bridge 271 that connects local bus 261 to global bus 266, a bus bridge 272 that connects local bus 262 to global bus 266, a bus bridge 273 that connects local bus 263 to global bus 266, a bus bridge 274 that connects local bus 264 to global bus 266, a bus bridge 275 that connects local bus 265 to global bus 266, a clock generation circuit 152 that generates a clock that is multiplied based on a clock 151 input from outside, and a power supply regulator 280 that supplies a predetermined power supply to each section based on an external power supply 161.

First function block 210 is configured by means of a first clock generation circuit 211 that generates a first system clock ($f_{CLK1}$) 214, first internal memory 212, and a selector 213 that selects first system clock 214, or a second system clock 224, or a third system clock 234, or a fourth system clock 244, or a fifth system clock 254, and supplies the selected clock to first internal memory 212.

Second function block 220 is configured by means of a second clock generation circuit 221 that generates second system clock ($f_{CLK2}$) 224, second internal memory 222, and a selector 223 that selects first system clock 214, or second system clock 224, or third system clock 234, or fourth system clock 244, or fifth system clock 254, and supplies the selected clock to second internal memory 222.

Similarly, third function block 230 is configured by means of a third clock generation circuit 231 that generates third system clock ($f_{CLK3}$) 234, third internal memory 232, and a selector 233 that selects first system clock 214, or second system clock 224, or third system clock 234, or fourth system clock 244, or fifth system clock 254, and supplies the selected clock to third internal memory 232.

Fourth function block 240 is configured by means of a fourth clock generation circuit 241 that generates fourth system clock ($f_{CLK4}$) 244, fourth internal memory 242, and a selector 243 that selects first system clock 214, or second system clock 224, or third system clock 234, or fourth system clock 244, or fifth system clock 254, and supplies the selected clock to fourth internal memory 242.

Fifth function block 250 is configured by means of a fifth clock generation circuit 251 that generates fifth system clock ($f_{CLK5}$) 254, fifth internal memory 252, and a selector 253 that selects first system clock 214, or second system clock 224, or third system clock 234, or fourth system clock 244, or fifth system clock 254, and supplies the selected clock to fifth internal memory 252.

An example of the connections of above first internal memory 212 and second internal memory 222 will be illustrated later herein using FIG. 13, taking first internal memory 212 as an example.

Clock generation circuit 152 generates system clock 153, and supplies generated system clock 153 to first clock generation circuit 211 in first function block 210, second clock generation circuit 221 in second function block 220, third clock generation circuit 231 in third function block 230, fourth clock generation circuit 241 in fourth function block 240, fifth clock generation circuit 251 in fifth function block 250, SDRAM control circuit 131, and DMA controller 132.

First system clock ($f_{CLK1}$) 214 supplied to circuitry in first function block 210 is generated by first clock generation circuit 211 in first function block 210. Similarly, second system clock ($f_{CLK2}$) 224 supplied to circuitry in second function block 220 is generated by second clock generation circuit 221 in second function block 220, third system clock ($f_{CLK3}$) 234 supplied to circuitry in third function block 230 is generated by third clock generation circuit 231 in third function block 230, fourth system clock ($f_{CLK4}$) 244 supplied to circuitry in fourth function block 240 is generated by fourth clock generation circuit 241 in fourth function block 240, and fifth system clock ($f_{CLK5}$) 254 supplied to circuitry in fifth function block 250 is generated by fifth clock generation circuit 251 in fifth function block 250.

Also, although not shown in FIG. 12, first system clock 214 generated by first clock generation circuit 211 in first function block 210 is not only supplied to selector 213, but is also supplied to selector 223 through selector 253 in second through fifth function blocks 220 through 250. The situation is also similar for the other system clocks.

Power supply regulator 280 supplies a power supply 281 to first function block 210, a power supply 282 to second function block 220, a power supply 283 to third function block 230, a power supply 284 to fourth function block 240, and a power supply 285 to fifth function block 250.

In this embodiment, overall flow control relationships are incorporated in a main program stored in internal memory 212 in first function block 210 that is assumed to be a general-purpose CPU, and AV related processing and the like requiring processing capability is incorporated in subprograms stored in internal memories 222 through 252 in second through fifth function blocks 220 through 250 that are assumed to be a multifunction DSPs. In this sense, management of the overall work of the semiconductor integrated circuit apparatus is performed by first function block 210 that is assumed to be a general-purpose CPU.

The operation of semiconductor integrated circuit apparatus 200 configured as described above will now explained.

By means of first clock generation circuit 211 in first function block 210, first system clock 214 necessary for performing an amount of computational processing that varies depending on the time axis of first function block 210 is generated based on system clock 153 supplied to semiconductor integrated circuit apparatus 200, using an internal PLL circuit (see FIG. 6).

Similarly, second clock generation circuit 221 in second function block 220 generates second system clock 224 necessary for performing an amount of computational processing that varies depending on the time axis of second function block 220; third clock generation circuit 231 in third function block 230 generates third system clock 234 necessary for performing an amount of computational processing that varies depending on the time axis of third function block 230; fourth clock generation circuit 241 in fourth function block 240 generates fourth system clock 244 necessary for performing an amount of computational processing that varies depending on the time axis of fourth function block 240; and fifth clock generation circuit 251 in fifth function block 250 generates fifth system clock 254 necessary for performing an amount, of computational processing that varies depending on the time axis of fifth function block 250.

First function block 210 that is a general-purpose CPU has large-capacity internal memory 212, and a scheduler (not shown) in this first function block 210 that is a general-purpose CPU controls the overall operation of semiconductor integrated circuit apparatus 200. To be precise, this scheduler is implemented by main program execution by the general-purpose CPU.

First function block 210 stores the following information in internal memory 212 for controlling the overall operation of semiconductor integrated circuit apparatus 200 by executing the above-mentioned main program. That is to say, internal memory 212 of first function block 210 holds information as to what processing capability is necessary for second function block 220 to perform what amount of work from what time, what frequency second function block 220 to operate at for that purpose, and what power supply voltage must be set in order for second function block 220 to operate at that operating frequency; information as to what processing capability is necessary for third function block 230 to perform what amount of work from what time, what frequency third function block 230 is to operate at for that purpose, and what power supply voltage must be set in order for third function block 230 to operate at that operating frequency; information as to what processing capability is necessary for fourth function block 240 to perform what amount of work from what time, what frequency fourth function block 240 is to operate at for that purpose, and what power supply voltage must be set in order for fourth function block 240 to operate at that operating frequency; and information as to what processing capability is necessary for fifth function block 250 to perform what amount of work from what time, what frequency fifth function block 250 is to operate at for that purpose, and what power supply voltage must be set in order for fifth function block 250 to operate at that operating frequency.

The power supply voltages of first function block 210, second function block 220, third function block 230, fourth function block 240, and fifth function block 250 are generated by on-chip power supply regulator 280, and power supply 281 is supplied to first function block 210, power supply 282 to second function block 220, power supply 283 to third function block 230, power supply 284 to fourth function block 240, and power supply 285 to fifth function block 250.

Figure 13:
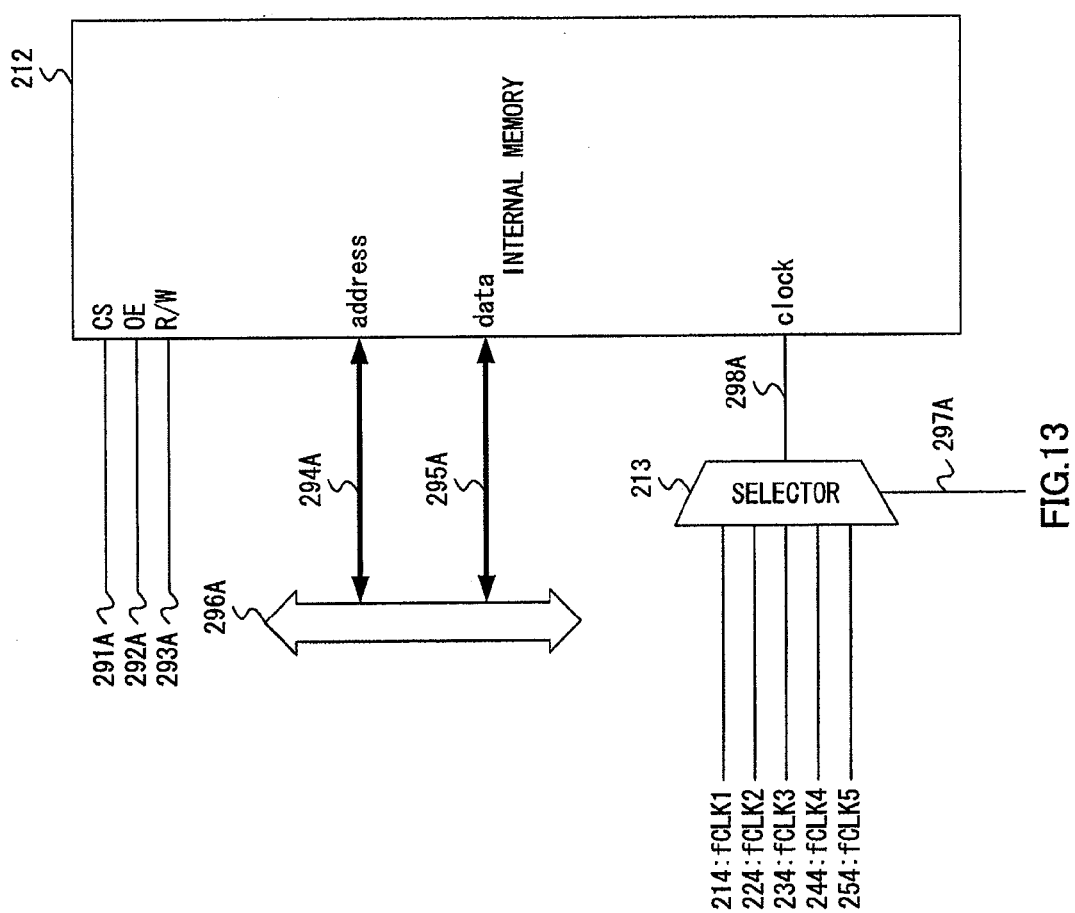
FIG. 13 is a drawing showing connections of internal memory in a first function block of a semiconductor integrated circuit apparatus according to Embodiment 2.
Figure 14:
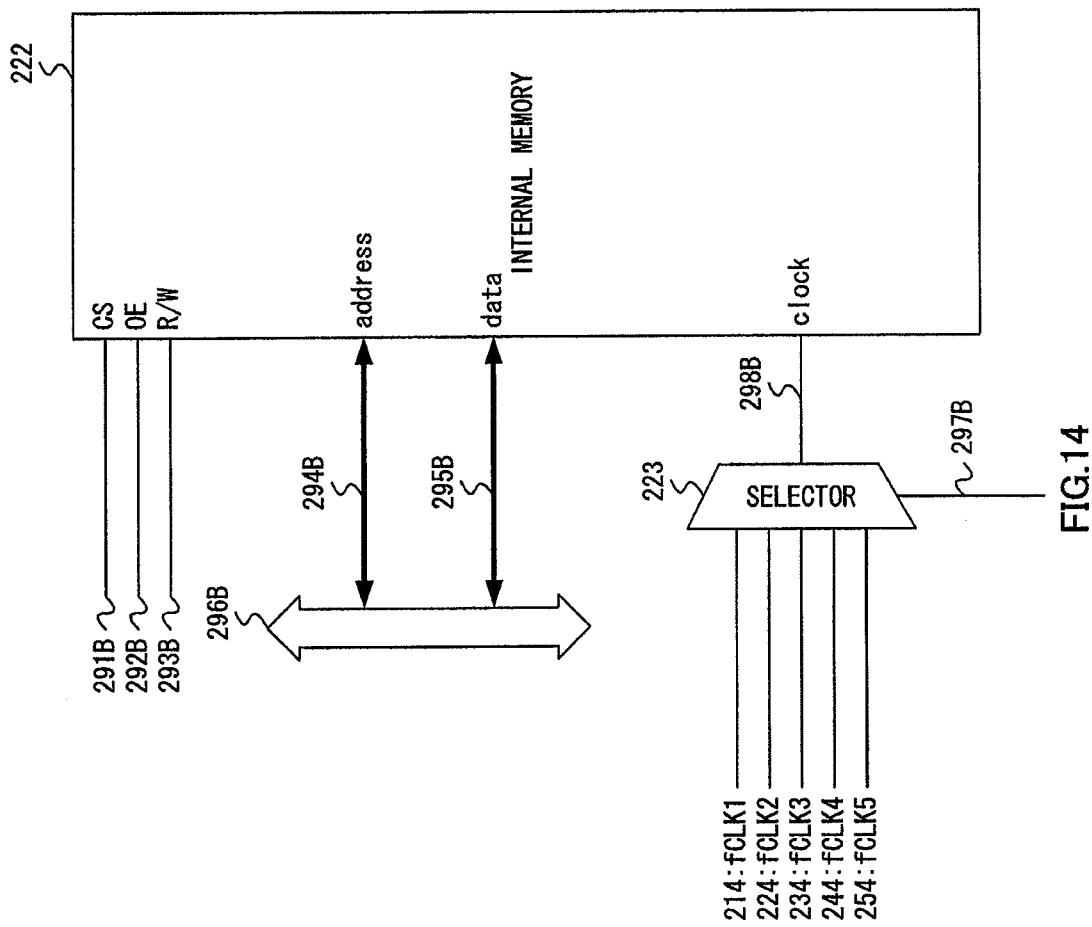
FIG. 14 is a drawing showing connections of internal memory in a second function block of a semiconductor integrated circuit apparatus according to Embodiment 2.

FIG. 13 is a drawing showing connections of internal memory 212 in first function block 210 above, and FIG. 14 is a drawing showing connections of internal memory 222 in second function block 220 above.

In FIG. 13, reference code 212 denotes first internal memory in first function block 210 (internal memory <1>), reference code 291A de notes a chip select signal, reference code 292A denotes an output enable signal, reference code 293A denotes a read/write signal, reference code 294A denotes an address signal, reference code 295A denotes a data signal, reference code 296A denotes a local bus, reference code 214 denotes a first system clock supplied to circuitry in first function block 210, reference code 224 denotes a second system clock supplied to circuitry in second function block 220, reference code 234 denotes a third system clock supplied to circuitry in third function block 230, reference code 244 denotes a fourth system clock supplied to circuitry in fourth function block 240, reference code 254 denotes a fifth system clock supplied to circuitry in fifth function block 250, reference code 213 denotes a selector, reference code 297A denotes a selector 213 control signal, and reference code 298A denotes a system clock signal that is first system clock 214 supplied to circuitry in first function block 210, or second system clock 224 supplied to circuitry in second function block 220, or third system clock 234 supplied to circuitry in third function block 230, or fourth system clock 244 supplied to circuitry in fourth function block 240, or fifth system clock 254 supplied to circuitry in fifth function block 250, selected by means of selector 213 control signal 297A.

In FIG. 14, reference code 222 denotes second internal memory in second function block 220 (internal memory <2>), reference code 291B denotes a chip select signal, reference code 292B denotes an output enable signal, reference code 293B denotes a read/write signal, reference code 294B denotes an address signal, reference code 295B denotes a data signal, reference code 296B denotes a local bus, reference code 214 denotes a first system clock supplied to circuitry in first function block 210, reference code 224 denotes a second system clock supplied to circuitry in second function block 220, reference code 234 denotes a third system clock supplied to circuitry in third function block 230, reference code 244 denotes a fourth system clock supplied to circuitry in fourth function block 240, reference code 254 denotes a fifth system clock supplied to circuitry in fifth function block 250, reference code 223 denotes a selector, reference code 297B denotes a selector 223 control signal, and reference code 298B denotes a system clock signal that is first system clock 214 supplied to circuitry in first function block 210, or second system clock 224 supplied to circuitry in second function block 220, or third system clock 234 supplied to circuitry in third function block 230, or fourth system clock 244 supplied to circuitry in fourth function block 240, or fifth system clock 254 supplied to circuitry in fifth function block 250, selected by means of selector 223 control signal 297B.

[Operation to Write a Data Signal in First Function Block 210 to Second Internal Memory 222 in Second Function Block 220]

When it is wished for first function block 210 to take the initiative and write a data signal in first function block 210 to internal memory 222 in second function block 220, after confirming that internal memory 222 in second function block 220 is not being used by circuitry in second function block 220, selector 223 control signal 297B (see FIG. 14) is controlled and a setting is made so that first system clock 214 supplied to circuitry in first function block 210 is selected as system clock 298B. Then, chip select signal 291B is set to "H", read/write signal 293B is set to "write state", address 294B of internal memory 222 in second function block 220 is set, and bus bridge 271 and bus bridge 272 are controlled so that a data signal in first function block 210 is sent to data signal 295B of internal memory 222 in second function block 220 via local bus 261, global bus 266, and local bus 262, and is then written to internal memory 222 in second function block 220.

[Operation to Read a Data Signal of Internal Memory 222 in Second Function Block 220 into Internal Memory 212 in First Function Block 210]

When first function block 210 takes the initiative and reads a data signal of internal memory 222 in second function block 220 into first function block 210, after confirming that internal memory 222 in second function block 220 is not being used by circuitry in second function block 220, selector 213 control signal 297A (see FIG. 13) is controlled and a setting is made so that first system clock 214 supplied to circuitry in first function block 210 is selected as system clock 298A, chip select signal 291A is set to "H", read/write signal 293A is set to "read state", address 294A of internal memory 222 in second function block 220 is set to an address of an area to be read, and bus bridge 272 and bus bridge 271 are controlled so that a data signal stored in internal memory 222 in second function block 220 is read into first function block 210 via local bus 262, global bus 266, and local bus 261.

Implementation is also possible in the same way as described above when it is wished for first function block 210 to take the initiative and write a data signal in second function block 220 to internal memory 212 in first function block 210, or to read a data signal of internal memory 212 in first function block 210 into second function block 220.

While data writing and reading between first function block 210 and second function block 220 has been described above, mutual data writing and reading among first function block 210, second function block 220, third function block 230, fourth function block 240, and fifth function block 250 can be implemented in the same way. However, since it is assumed in this embodiment that first function block 210 is a general-purpose CPU and the other function blocks—second function block 220, third function block 230, fourth function block 240, and fifth function block 250—are multifunction DSPs, semiconductor integrated circuit apparatus 200 that is a general-purpose CPU ultimately manages the operation of semiconductor integrated circuit apparatus 200 overall in this embodiment. Therefore, in mutual data writing and reading among first function block 210, second function block 220, third function block 230, fourth function block 240, and fifth function block 250, first function block 210, second function block 220, third function block 230, fourth function block 240, and fifth function block 250 basically perform mutual data reads and writes under the management of first function block 210 that is a general-purpose CPU, in accordance with directives of first function block 210 that is a general-purpose CPU.

Embodiment 3

Figure 15:
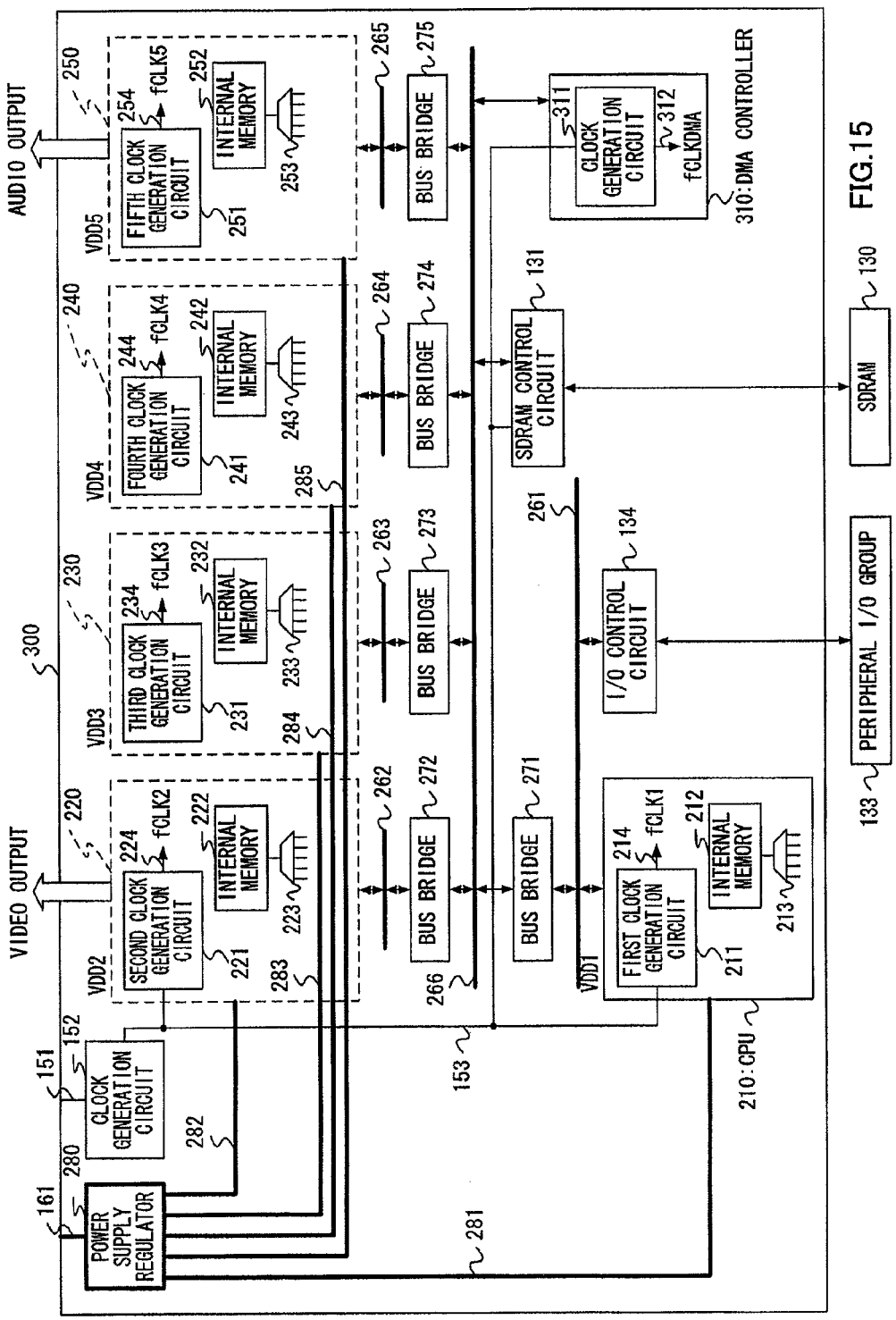
FIG. 15 is a block diagram showing the configuration of a semiconductor integrated circuit apparatus according to Embodiment 3.

FIG. 15 is a circuit block diagram showing the configuration of a semiconductor integrated circuit apparatus according to Embodiment 3 of the present invention. This embodiment is an example of a case in which a clock generation circuit is provided in a DMA controller of a semiconductor integrated circuit apparatus. Configuration parts identical to those in FIG. 12 are assigned the same codes as in FIG. 12 and descriptions of duplicate parts are omitted.

In FIG. 15, a semiconductor integrated circuit apparatus 300 is configured by means of a first function block 210 assumed to be a general-purpose CPU, a second function block 220, a third function block 230, a fourth function block 240, a fifth function block 250, an SDRAM control circuit 131 that controls SDRAM 130, a DMA controller 310 equipped with a clock generation circuit, an I/O control circuit 134 that controls a peripheral I/O group 133, a local bus 261 located on the first function block 210 and I/O control circuit 134 side, a local bus 262 located on the second function block 220 side, a local bus 263 located on the third function block 230 side, a local bus 264 located on the fourth function block 240 side, a local bus 265 located on the fifth function block 250 side, a global bus 266 located between local bus 261 and local buses 262 through 265, a bus bridge 271 that connects local bus 261 to global bus 266, a bus bridge 272 that connects local bus 262 to global bus 266, a bus bridge 273 that connects local bus 263 to global bus 266, a bus bridge 274 that connects local bus 264 to global bus 266, a bus bridge 275 that connects local bus 265 to global bus 266, a clock generation circuit 152 that generates a clock that is multiplied based on a clock 151 input from outside, and a power supply regulator 280 that supplies a predetermined power supply to each section based on an external power supply 161.

A DMA controller clock generation circuit 311 is provided in DMA controller 310. Reference code 312 denotes a DMA controller clock generated by DMA controller clock generation circuit 311.

The circuit configuration of DMA controller clock generation circuit 311 in DMA controller 310 is the same as that of previously described second clock generation circuit 221 in second function block 220 shown in FIG. 12 and FIG. 6. Division ratio N/M of the frequency of an output signal from a VCO set by a control signal from first function block 210 (first function block 110 in FIG. 5) that is assumed to be a general-purpose CPU can be varied. That is to say, the clock frequency that determines the transfer speed of DMA controller 310 can be controlled by a signal from first function block 210 that is assumed to be a general-purpose CPU.

Figure 16:
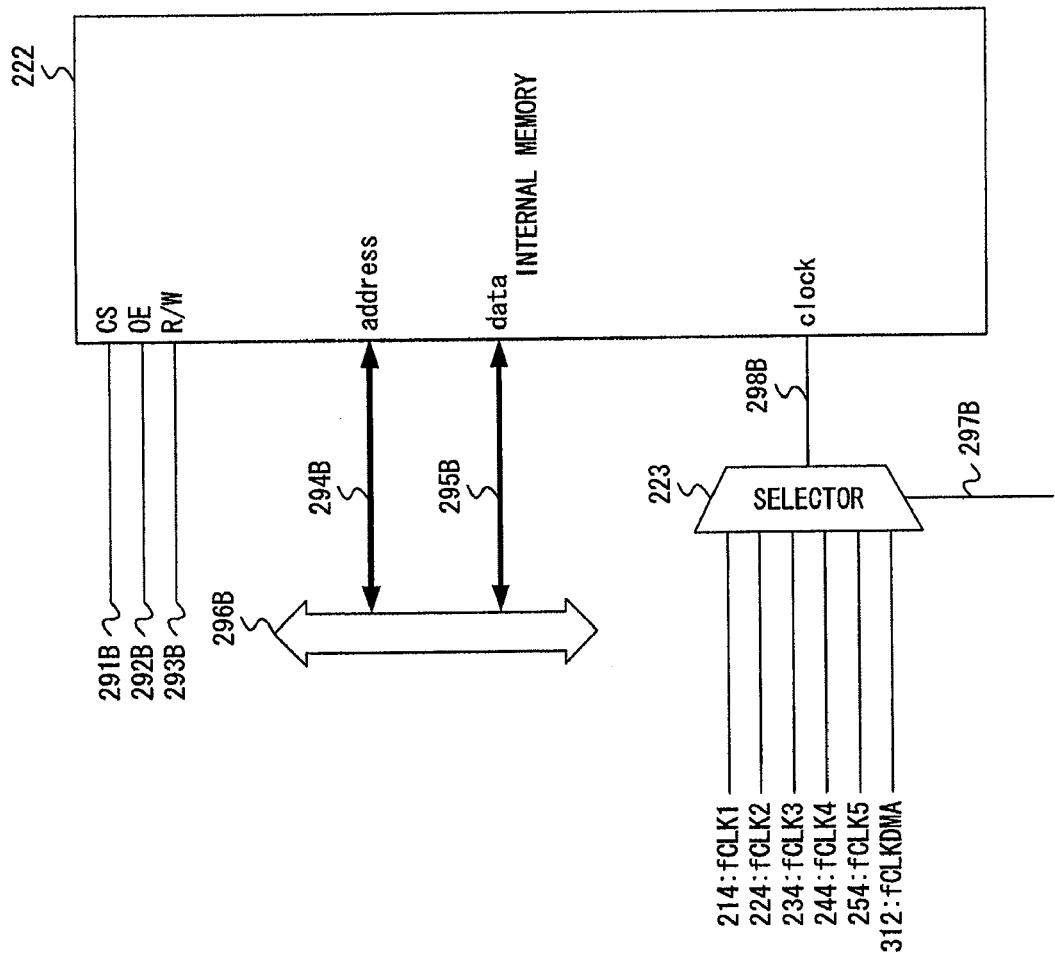
FIG. 16 is a drawing showing connections of internal memory in a second function block of a semiconductor integrated circuit apparatus according to Embodiment 3.
Figure 17:
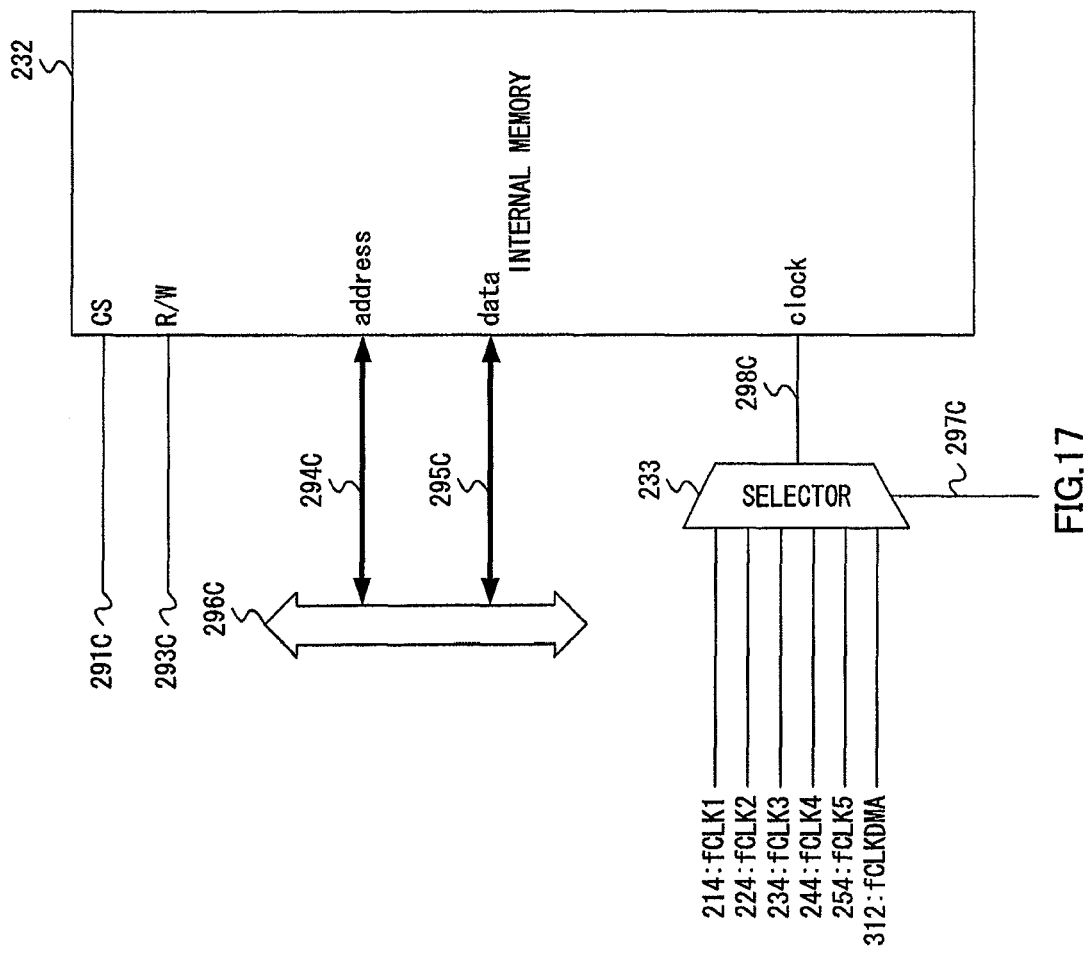
FIG. 17 is a drawing showing connections of internal memory in a third function block of a semiconductor integrated circuit apparatus according to Embodiment 3.

FIG. 16 is a drawing showing connections of internal memory 222 in second function block 220 above, and FIG. 17 is a drawing showing connections of third internal memory 232 in third function block 230 above.

In FIG. 16, DMA controller clock 312 is additionally input to selector 223 in second function block 220. Similarly, in FIG. 17, DMA controller clock 312 is additionally input to selector 233 in third function block 230.

The operation of semiconductor integrated circuit apparatus 300 configured as described above will now explained. As the basic operation is similar to that of Embodiment 2, a description thereof is omitted, and the operation of DMA controller 310 is explained.

When DMA controller 310 takes the initiative and transfers a data signal of internal memory 222 in second function block 220 to internal memory 232 in third function block 230, after confirming that internal memory 222 in second function block 220 is not being used by circuitry in second function block 220, control signal 297B of selector 223 in second function block 220 is controlled and a setting is made so that DMA controller clock 312 supplied to circuitry in DMA controller 310 is selected as system clock 298B, chip select signal 291B is set to "H", read/write signal 293B is set to "read state", and address 294B of internal memory 222 in second function block 220 is set to an address of an area to be read.

Then, after confirming that internal memory 232 in third function block 230 is not being used by circuitry in third function block 230, control signal 297C of selector 233 in third function block 230 is controlled and a setting is made so that DMA controller clock 312 supplied to circuitry in DMA controller 310 is selected as system clock 298C, chip select signal 291C is set to "H", read/write signal 293C is set to "write state", address 294C of internal memory 232 in third function block 230 is set to an address of an area to be written to, and bus bridge 272 and bus bridge 273 are controlled so that a data signal stored in internal memory 222 in second function block 220 is transferred to internal memory 232 in third function block 230 via local bus 262, global bus 266, and local bus 263.

Thus, even though the second function block through fifth function block operate on their own system clocks, having DMA controller 310 control the operation of internal memories 212 through 252 with DMA controller clock 312 supplied to circuitry in DMA controller 310, using a time when the respective internal memory related resources are not being used, enables data to be transferred freely among the second through fifth function blocks.

When first function block 210 that is a general-purpose CPU is busy with other work, DMA controller 310 of this embodiment—in the same way as with an ordinary DMA controller—is delegated by first function block 210 to execute transfer of data signals between function blocks other than first function block 210, which constitute part of the work of first function block 210. In this case, also, overall semiconductor integrated circuit apparatus 300 operation is managed by first function block 210 that is a general-purpose CPU and DMA controller 310 is delegated to implement data transfer between two function blocks only temporarily, and when data transfer between two function blocks ends DMA controller 310 reports "data transfer between two function blocks ended information" to first function block 210 that is a general-purpose CPU.

Thus, DMA controller 310 of semiconductor integrated circuit apparatus 300 has an internal DMA controller clock generation circuit 311, and can generate its own DMA controller clock 312. Therefore, if, at the time of data transfer between two function blocks among second function block 220 through fifth function block 250, the respective function blocks are performing their own work at their own operating frequencies without using internal memory related resources, a system clock $f_{CLKDMA}$ having an operating frequency deemed necessary for data transfer between the two function blocks is generated by DMA controller clock generation circuit 311 in DMA controller 310, and a data signal can be transferred between the function blocks using this system clock $f_{CLKDMA}$ without involving first function block 210.

The above descriptions are illustrations of preferred embodiments of the present invention, but the present invention is in no way limited to these embodiments, and various variations and modifications may be possible without departing from the scope of the present invention.

For example, in the embodiments a case has been described in which a clock generation circuit is provided in each function block and generates an individual system clock, but it is not absolutely necessary for all function blocks to have their own clock generation circuits. A number of function blocks may also use a system clock generated by a clock generation circuit as a system clock in a function block.

Furthermore, the present invention also includes a configuration whereby clock generation circuit functions of all function blocks are aggregated in a block of a clock generation circuit that generates a clock multiplied based on a clock input from outside a semiconductor integrated circuit apparatus, and a system clock gene rated as a result is supplied to each function block.

Moreover, in above Embodiment 2 or Embodiment 3, the second function block through fifth function block have all been defined as "multifunction DSPs," but the present invention also includes a case in which a particular function block only executes computation centered processing and does not correspond to what is generally called a "DSP."

Also, a case has been described in which four function blocks—the second function block through fifth function block—are function blocks that are assumed to be "multifunction DSPs," but this number is not, of course, limited to four.

Furthermore, in the above embodiments, operating voltages and operating frequencies appropriate to the work of each function block are read from Table 1 stored in the operation program. This table is assumed to be decided upon based on a prior investigation of the respective work contents contained in the operation program, and a thorough simulation as to what kind of operating frequency is necessary when the respective items of work are performed by the multifunction DSP of second function block 120, and what kind of power supply voltage it is necessary to set for that purpose.

In addition to the above-described method of implementing Dynamic Voltage Scaling (DVS) technology, there is a method in which a closed loop is formed whereby the system load is monitored by a Hardware Performance Monitor, Intelligent Energy Management (IEM) and Adaptive Power Control (APC) request an optimal power supply voltage and operating frequency for the load from outside, and in response to this request, an external power supply frequency generation circuit incorporating a DC-DC converter supplies an optimal power supply voltage and operating frequency to the chip. This method is also referred to as Adaptive Voltage Scaling (AVS) technology.

However, as the content of the present invention does not relate to a method of implementing Dynamic Voltage Scaling (DVS) technology, although an implementation method of Dynamic Voltage Scaling (DVS) technology such as mentioned in Embodiment 1 through Embodiment 3 has been used in implementation examples in the description, the kind of Dynamic Voltage Scaling (DVS) technology described in above-cited Non-patent Document 1 can, of course, also be used.

Also, while the term "semiconductor integrated circuit apparatus" has been used in these embodiments, this has been done for the sake of convenience, and a term such as "semiconductor integrated circuit" or the like may, of course, also be used.

Furthermore, the type, number, connection method, and so forth of circuit parts—such as selectors, for example—making up an above-described semiconductor integrated circuit apparatus are not limited to the above-described embodiments.

Thus, as described above, according to the present invention, a first function block and second internal memory in a second function block in which data is read/written both operate on a first system clock supplied to circuitry in the first function block, and therefore the first function block and the second internal memory in the second function block are completely synchronized. Therefore, it is possible for data to be transferred between the function blocks even if the respective function blocks change power supply voltage and system clock frequency freely according to the function block load using Dynamic Voltage Scaling technology or Adaptive Voltage Scaling technology. By this means, this system LSI can achieve low power consumption by making maximum use of Dynamic Voltage Scaling technology or Adaptive Voltage Scaling technology.

Therefore, a semiconductor integrated circuit apparatus according to the present invention is effective for flexible data transfer between function blocks in a semiconductor integrated circuit, and in particular, a system LSI suitable for low-power-consumption implementation using Dynamic Voltage Scaling (DVS) technology.

What is claimed is:

1. A semiconductor integrated circuit apparatus comprising:
   a first function block that comprises an internal memory storing an operation program and a processor that performs the operation program;
   a second function block that comprises a first clock generation circuit including a first phase locked loop circuit; and
   a third function block that comprises a second clock generation circuit including a second phase locked loop circuit, wherein:
   the internal memory stores, in a form of a program, work contents of the second and third function blocks, an operating frequency for executing each of the work contents in a predetermined time, a power supply voltage that operates the second and third function blocks at the operating frequency, and a frequency division ratio of a phase locked loop to set in the first and second clock generation circuits so that the second and third function blocks operate at the operating frequency;
   when the work content of the second function block is determined, the processor directs a power regulator to supply a necessary power supply voltage to the second function block with reference to the operation program stored in the internal memory, and sets the frequency division ratio of the phase locked loop in the first clock generation circuit of the second function block so that the second function block operates at the operating frequency of the work content;
   when the work content of the third function block is determined, the processor directs the power regulator to supply a necessary power supply voltage to the third function block with reference to the program stored in the internal memory, and sets the frequency division ratio of the second phase locked loop in the second clock generation circuit of the third function block so that the third function block operates at the operating frequency of the work content; and
   the first and second clock generation circuits generate a clock of a necessary operation frequency, using a clock signal from a main clock generation circuit, based on a frequency division ratio of the phase locked loop set by the processor.

2. The semiconductor integrated circuit apparatus according to claim 1, wherein the processor reads power supply voltages necessary for operating the determined work contents of the second function block and the third function block stored in the internal memory, reads frequency division ratios of the first phase locked loop circuit and the second phase locked loop circuit stored in the internal memory, and provides the read power supply voltages and the read frequency division ratios to the first phase locked loop circuit and the second phase locked loop circuit.

3. The semiconductor integrated circuit apparatus according to claim 1, wherein the first function block comprises a central processing unit, as the processor, and each of the second function block and the third function block comprises a digital signal processor.

4. The semiconductor integrated circuit apparatus according to claim 3, wherein the internal memory is one of a register file or a cache memory.

5. The semiconductor integrated circuit apparatus according to claim 4, wherein the second function block and the third function block respectively comprise internal memories,
   the semiconductor integrated circuit further comprising a direct memory access controller that controls mutual reading/writing between the internal memories in the second function block and the third function block.

6. The semiconductor integrated circuit apparatus according to claim 1, wherein each of the first function block, second function block and the third function block includes a selector that selects a clock signal from the clock signals generated by the second clock generation circuit and the third clock generation circuit.

* * * * *